United States Patent
Robb et al.

(10) Patent No.: US 10,254,361 B2
(45) Date of Patent: Apr. 9, 2019

(54) SYSTEMS AND METHODS FOR DISCONNECTING AN MRI RF COIL

(71) Applicant: General Electric Company, Schenectady, NY (US)

(72) Inventors: Fraser John Laing Robb, Aurora, OH (US); Robert Steven Stormont, Hartland, WI (US); Youqing Zhang, Holland, OH (US); Victor Taracila, Orange Village, OH (US); Miguel Angel Navarro, II, Sheffield Village, OH (US); Dan Kenrick Spence, Hartland, WI (US); Shuying Huang, Cleveland, OH (US); Peter Roemer, Tampa, FL (US)

(73) Assignee: General Electric Company, Schenectady, NY (US)

( * ) Notice: Subject to any disclaimer, the term of this patent is extended or adjusted under 35 U.S.C. 154(b) by 111 days.

(21) Appl. No.: 15/268,397

(22) Filed: Sep. 16, 2016

(65) Prior Publication Data

US 2018/0081006 A1    Mar. 22, 2018

(51) Int. Cl.
*G01R 33/36* (2006.01)
*G01R 33/341* (2006.01)

(52) U.S. Cl.
CPC ..... *G01R 33/3685* (2013.01); *G01R 33/3657* (2013.01); *G01R 33/341* (2013.01)

(58) Field of Classification Search
CPC .......... G01R 33/34007; G01R 33/3685; G01R 33/34; G01R 33/34902; G01R 33/3664; G01R 33/3415
See application file for complete search history.

(56) References Cited

U.S. PATENT DOCUMENTS

| 4,881,032 A * | 11/1989 | Bottomley ........... G01R 33/485 324/309 |
| 8,198,895 B2 | 6/2012 | Iannotti et al. |
| 8,638,093 B2 | 1/2014 | Aimi et al. |

(Continued)

OTHER PUBLICATIONS

Stormont, Robert Steven et al., "Systems and Methods for Disconnecting an MRI RF Coil," U.S. Appl. No. 15/268,277, Filed Sep. 16, 2016, 45 pages.

*Primary Examiner* — Tung X Nguyen
*Assistant Examiner* — Dominic E Hawkins
(74) *Attorney, Agent, or Firm* — McCoy Russell LLP

(57) ABSTRACT

Various methods and systems are provided for a disconnecting a receive coil from a transmit coil of a magnetic resonance (MR) system during a transmit operation. In one example, a cabling system may include a first line of coil-interfacing cable having a first set of hybrid switches, the first set of hybrid switches including a first switch, a first resonance circuit, and a second switch connected in series, and a second line of the coil-interfacing cable having a second set of hybrid switches, the first line and the second line of the coil-interfacing cable operably coupling one or more radio frequency (RF) coil elements to respective channels of the MR system. By positioning the first and the second sets of hybrid switches along different locations along the coil-interfacing cables, and simultaneously operating each set of hybrid switches, common mode currents may be interrupted along the coil-interfacing cables.

12 Claims, 13 Drawing Sheets

(56) References Cited

U.S. PATENT DOCUMENTS

| | | | |
|---|---|---|---|
| 8,749,237 B2* | 6/2014 | Iannotti | G01R 33/3657 |
| | | | 324/318 |
| 9,117,610 B2 | 8/2015 | Aimi et al. | |
| 2011/0095758 A1* | 4/2011 | Walsh | A61B 5/055 |
| | | | 324/307 |
| 2011/0312295 A1* | 12/2011 | Jiang | H03D 7/1408 |
| | | | 455/326 |
| 2014/0183340 A1 | 7/2014 | Iannotti et al. | |
| 2014/0184217 A1* | 7/2014 | Bulumulla | G01R 33/3635 |
| | | | 324/307 |
| 2014/0305777 A1 | 10/2014 | Aimi et al. | |
| 2015/0008926 A1* | 1/2015 | Yang | H05K 999/99 |
| | | | 324/322 |
| 2015/0177344 A1* | 6/2015 | Han | G01R 33/3628 |
| | | | 324/322 |
| 2016/0341804 A1 | 11/2016 | Taylan et al. | |
| 2018/0048294 A1* | 2/2018 | Gathman | H03H 11/32 |

\* cited by examiner

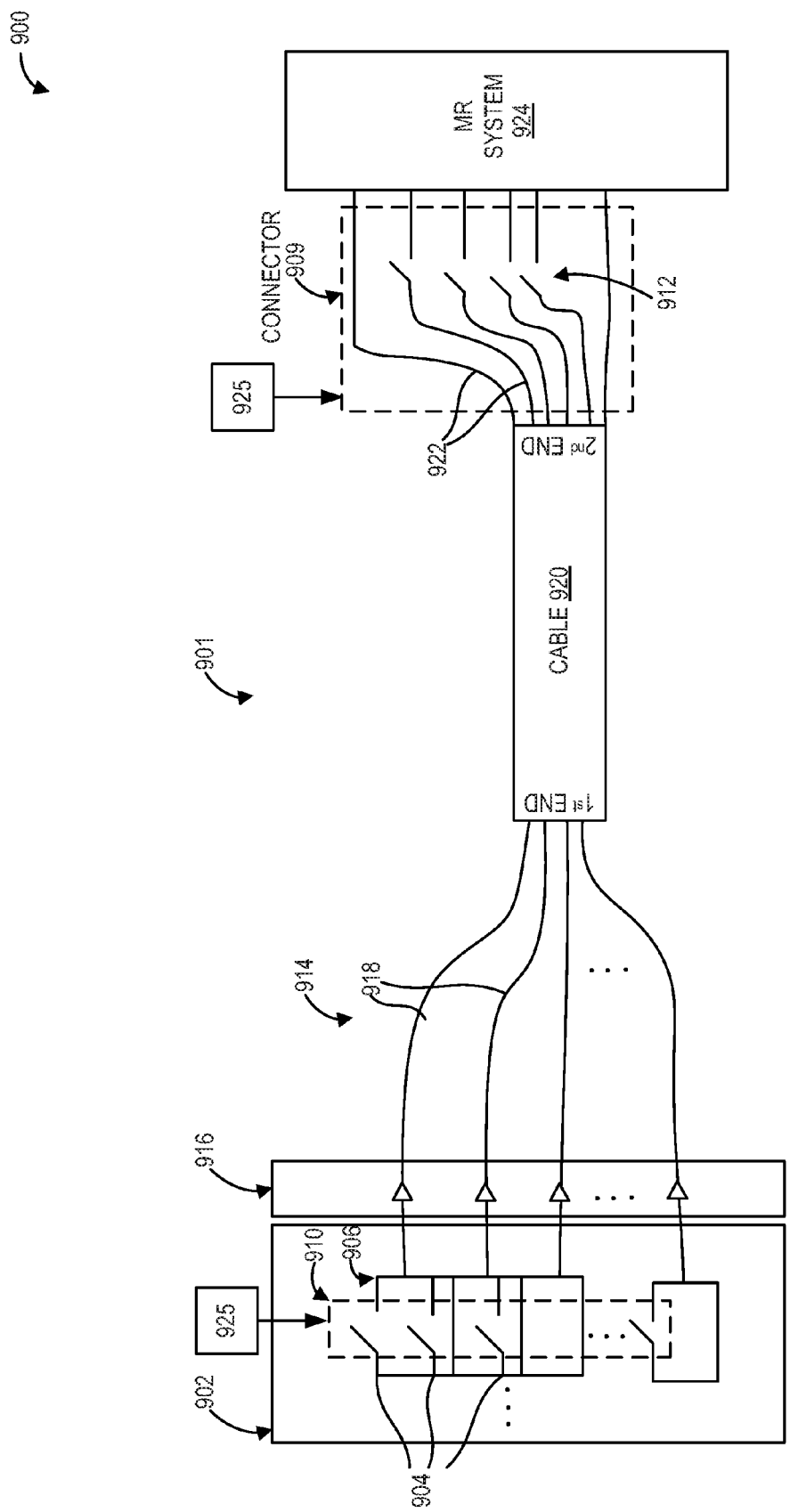

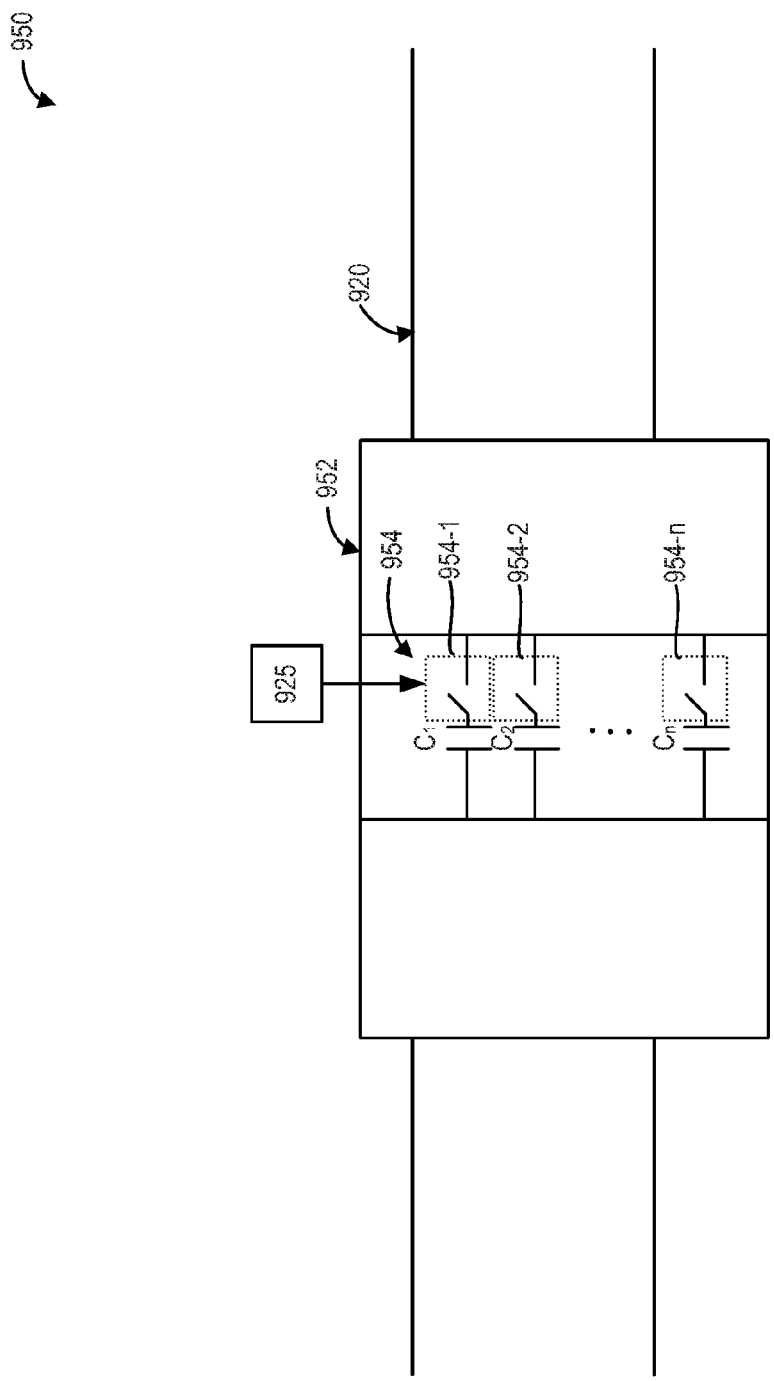

SYSTEMS AND METHODS FOR DISCONNECTING AN MRI RF COIL

FIELD

Embodiments of the subject matter disclosed herein relate to magnetic resonance imaging (MM), and more particularly, to disconnecting MRI radio frequency (RF) coils.

BACKGROUND

Magnetic resonance imaging (MRI) is a medical imaging modality that can create pictures of the inside of a human body without using x-rays or other ionizing radiation. MRI uses a superconducting magnet to create a strong, uniform, static magnetic field. When a human body, or part of a human body, is placed in the magnetic field, the nuclear spins associated with the hydrogen nuclei in tissue water become polarized, wherein the magnetic moments associated with these spins become preferentially aligned along the direction of the magnetic field, resulting in a small net tissue magnetization along that axis. MM systems also include gradient coils that produce smaller amplitude, spatially-varying magnetic fields with orthogonal axes to spatially encode the MR signal by creating a signature resonance frequency at each location in the body. Radio frequency (RF) coils are then used to create pulses of RF energy at or near the resonance frequency of the hydrogen nuclei, which add energy to the nuclear spin system. As the nuclear spins relax back to their rest energy state, they release the absorbed energy in the form of an RF signal. This signal is detected by the MRI system and is transformed into an image using a computer and known reconstruction algorithms.

As mentioned, RF coils are used in MRI systems to transmit RF excitation signals ("transmit coil"), and to receive the RF signals emitted by an imaging subject ("receive coil"). Coil-interfacing cables may be used to transmit signals between the RF coils and other aspects of the processing system, for example to control the RF coils and/or to receive information from the RF coils. The coil-interfacing cables may be disposed within the bore of the MM system and subjected to electro-magnetic fields produced and used by the MM system. The cables may support transmitter-driven common-mode currents, which create field distortions and/or unpredictable heating of components. These field distortions may result in a shadow of the cables appearing within an image reconstructed from received MR signals.

Conventionally, baluns (balanced to unbalanced) networks or common-mode traps that provide high common-mode impedances may be utilized to mitigate the effect of transmitter-driven currents. However, placing the common-mode traps or blocking circuits at appropriate locations may be difficult, as the appropriate placement may vary based on the positioning of a cable or coil associated with the common-mode traps. In addition, the common-mode traps may be difficult to manufacture and assemble. Furthermore, excessive voltage and/or power dissipation may occur even if conventional common-mode traps or blocking circuits are placed at appropriate locations. Further still, baluns or common-mode traps positioned too close to each other on a cable may become coupled due to fringe magnetic fields, thereby resulting in a detuning of the baluns, which may adversely affect the functioning of the baluns.

BRIEF DESCRIPTION

In one embodiment, a cabling system includes a first line of coil-interfacing cable having a first set of hybrid switches, the first set of hybrid switches having a first switch, a first resonance circuit, and a second switch connected in series, and a second line of the coil-interfacing cable having a second set of hybrid switches, the first line and the second line of the coil-interfacing cable operably coupling one or more radio frequency (RF) coil elements to respective channels of a magnetic resonance (MR) system. The first set of hybrid switches and the second set of hybrid switches may be operated to connect and disconnect a conductor path of the coil-interfacing cable, where the coil-interfacing cable couples one or more RF coils to a coupling circuit or module, and additionally couples the circuit to a MR system. As such, each set of hybrid switches may include a pair of MEMS switches coupled to opposite terminals of a resonance circuit. During a transmit operation, the first and the second set of hybrid devices may be operated such that the pairs of switches of each set of hybrid switch are open, thus providing common-mode interruptions of the coil-interfacing cable.

It should be understood that the brief description above is provided to introduce in simplified form a selection of concepts that are further described in the detailed description. It is not meant to identify key or essential features of the claimed subject matter, the scope of which is defined uniquely by the claims that follow the detailed description. Furthermore, the claimed subject matter is not limited to implementations that solve any disadvantages noted above or in any part of this disclosure.

BRIEF DESCRIPTION OF THE DRAWINGS

The present invention will be better understood from reading the following description of non-limiting embodiments, with reference to the attached drawings, wherein below:

FIG. 9A is schematic view of a cabling system including the plurality of hybrid switches coupled to an end of the coil-interfacing cable near or at a connector that connects the coil-interfacing cable to the MR system.

FIG. 9C is a schematic view of the cabling system with the plurality of hybrid switches integrated to cable traps positioned along the coil-interfacing cable.

DETAILED DESCRIPTION

Figure 2:
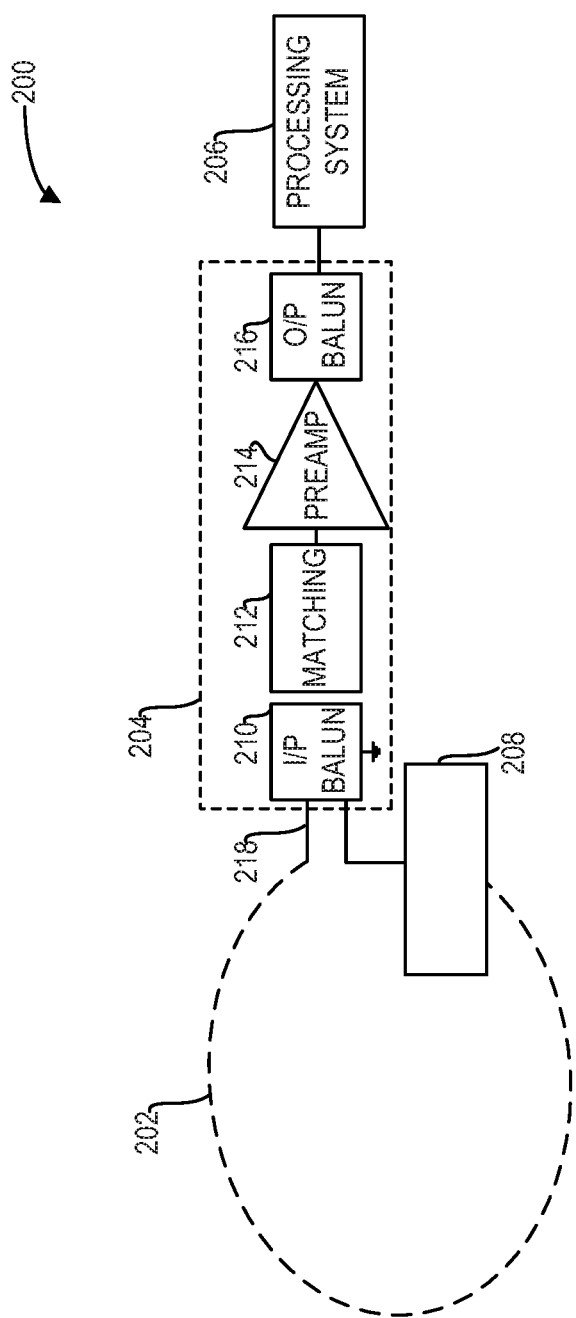
FIG. 2 is a schematic view of a radio frequency (RF) coil coupled via detuning element to a coupling circuit according to an embodiment of the invention.
Figure 3:
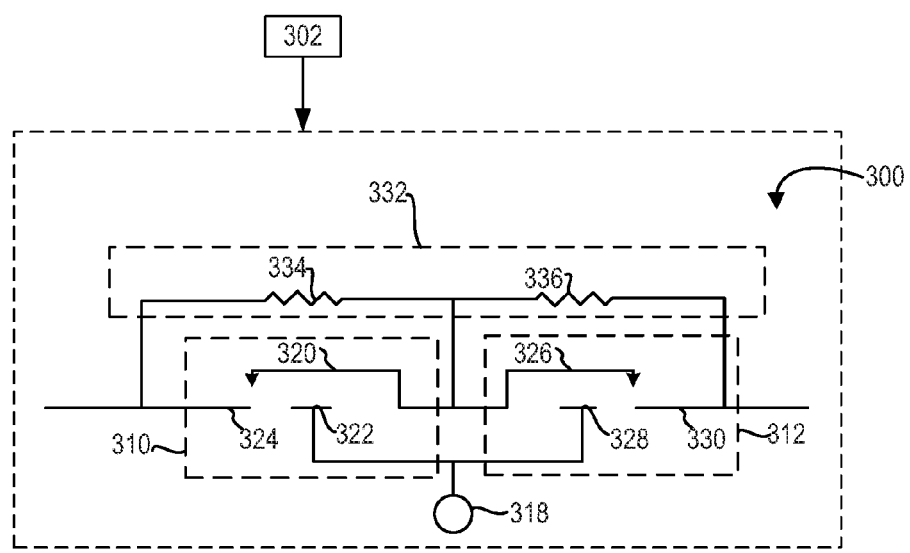
FIG. 3 is an example circuit diagram of a micro-electro mechanical system (MEMS) device according to an embodiment of the invention.
Figure 4:
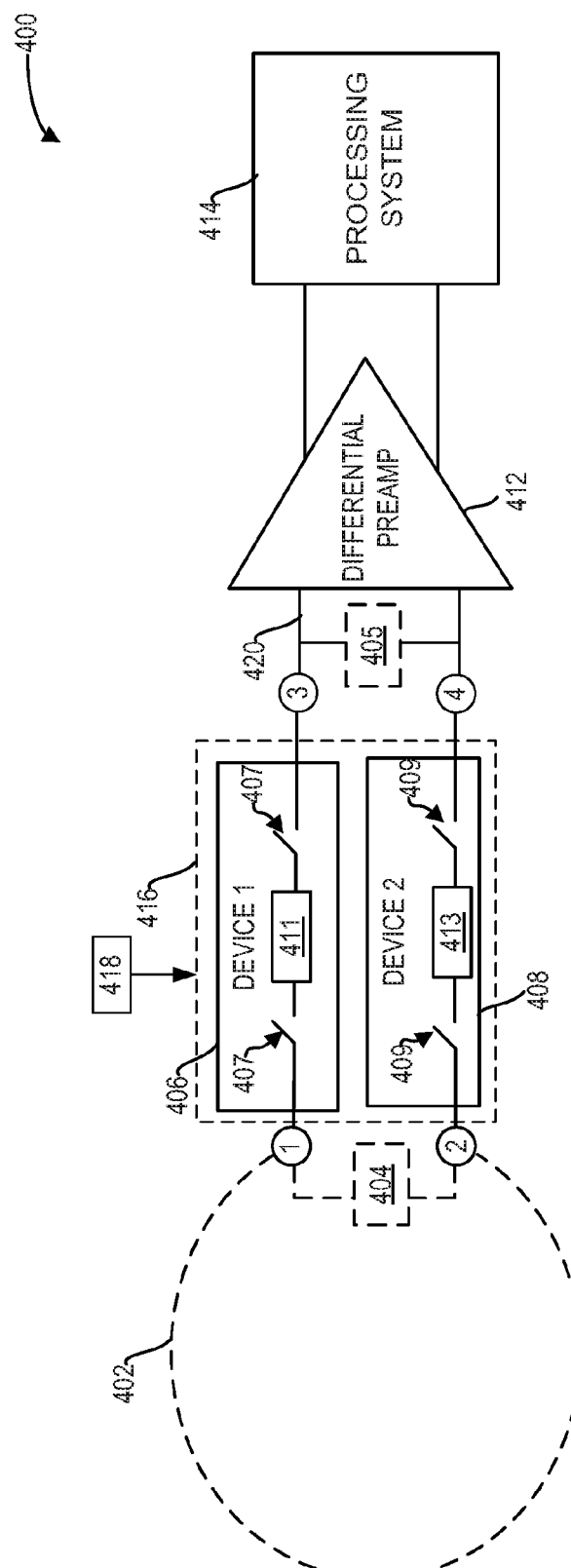
FIG. 4 is a schematic view of the RF coil coupled to the coupling circuit via a pair of switches according to an embodiment of the invention.
Figure 6A:
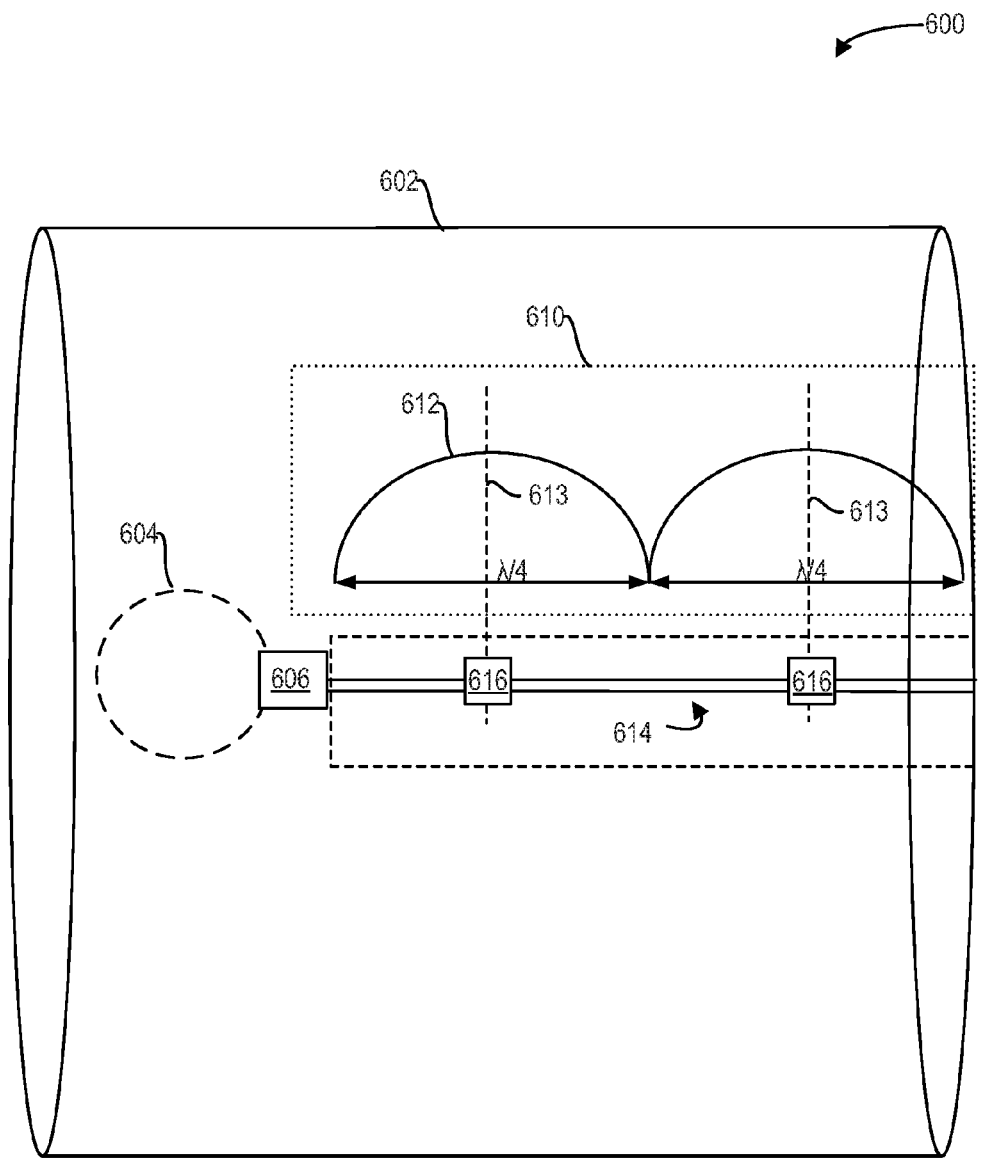
FIG. 6A is a schematic view of baluns placed along coil-interfacing cables of the RF coil and positioned within a body coil of the MM system according to an embodiment of the invention.
Figure 6B:
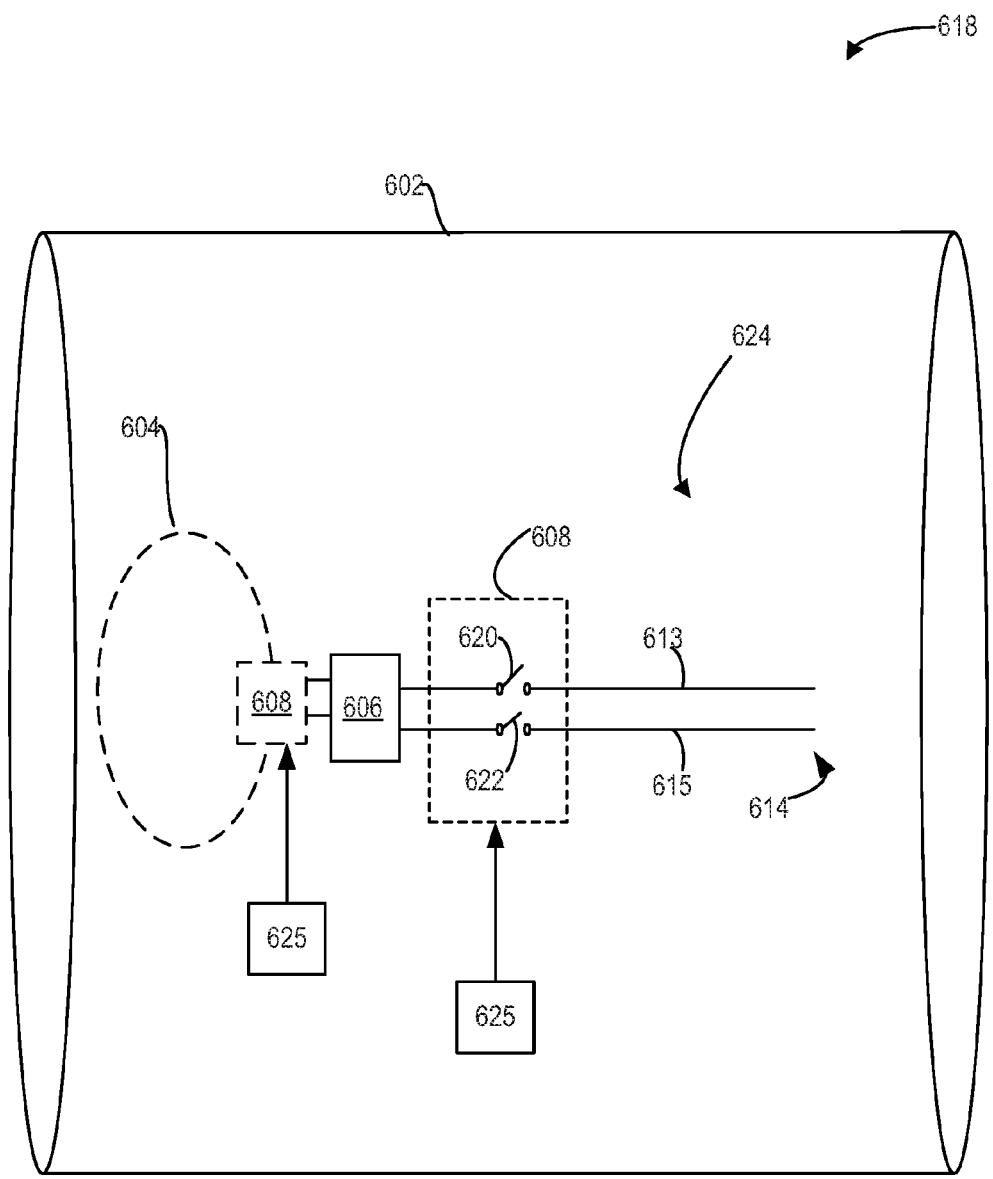
FIG. 6B is a schematic view of the pair of MEMS devices coupled to the coil-interfacing cables of the RF coil and positioned within the body coil of the MRI system according to an embodiment of the invention.
Figure 7:
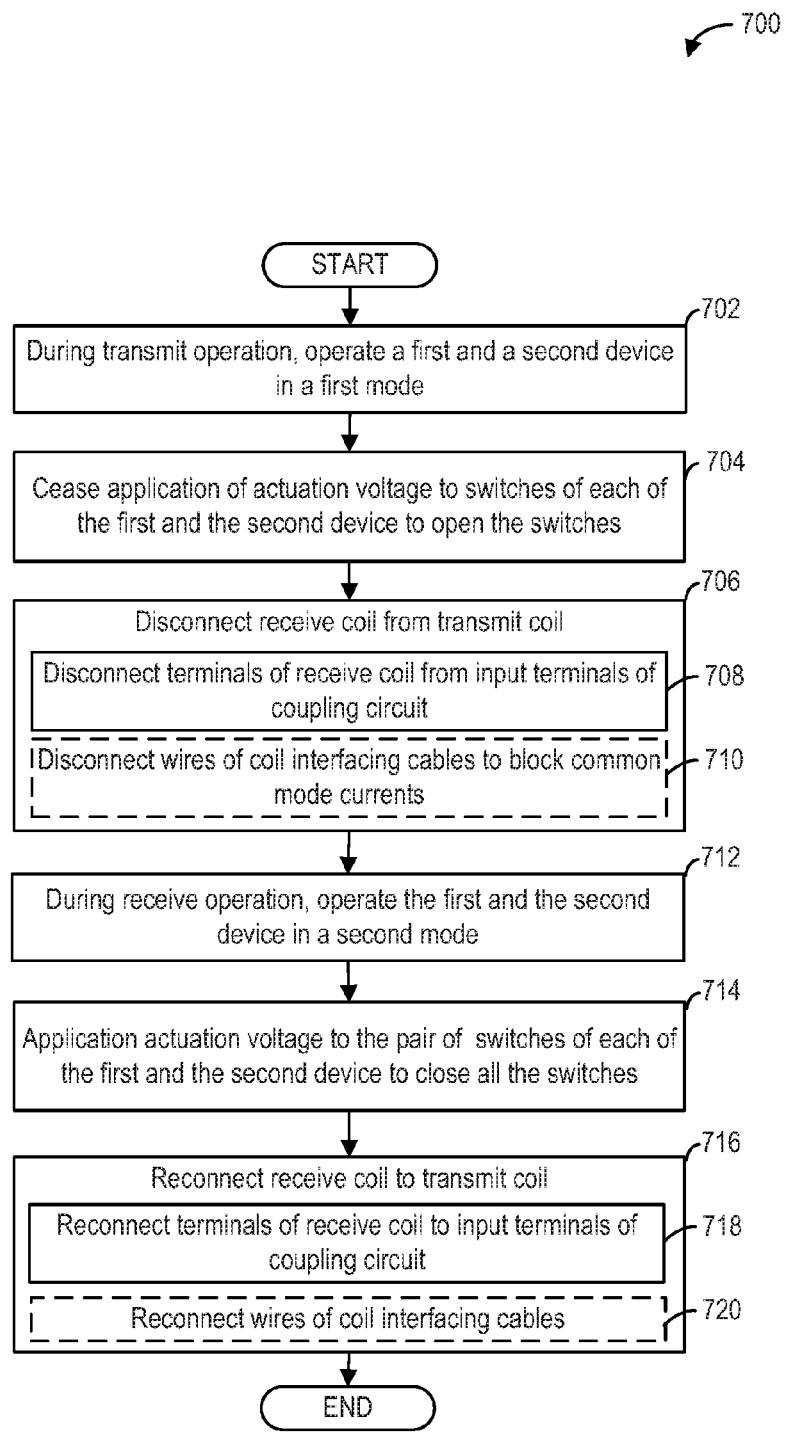
FIG. 7 is a high-level block diagram illustrating an example method for an opening and closing a conductor path of the coil-interfacing cables.

The following description relates to various embodiments of a radio frequency (RF) coil in MRI systems. In particular, systems and methods are provided for disconnecting a receive RF coil from a transmit RF coil during a transmit operation in an MRI system, such as the MRI system depicted in FIG. 1. As shown in FIG. 2, the RF coil may be coupled to a processing system via a detuning element and a coupling circuit. In one example, the detuning element may include a first micro-electro mechanical system (MEMS) device and a second MEMS device, each including two MEMS switches in a back-to-back configuration as shown in FIG. 3. In another example, each terminal of the RF coil may be coupled to the processing system via a device as shown in FIG. 4 to selectively disconnect the RF coil during transmit by opening switches of the device. The device may include one or more switches such as Gallium Nitride Field Effect Transistors (GaNFET), PIN diodes, MEMS devices, relays, and the like. Typically, baluns positioned along coil-interfacing cables as shown in FIG. 6A act as common-mode chokes, to reduce the transmission of common-mode current through the system. In an example embodiment, the device may be coupled to the coil-interfacing cables as shown in FIG. 6B, and may function as common-mode chokes. A method for disconnecting the receive coil from the transmit coil during transmit, and further using the device as common-mode chokes, is shown in FIG. 7. In an example embodiment, a set of hybrid switches may be coupled to lines of the coil-interfacing cables as shown in FIGS. 9A-C. Herein, each hybrid switch may include a pair of switches coupled to a resonant balun in series (FIG. 8A) or in parallel (FIG. 8B). The pair of switches of the hybrid switch may include one or more of MEMS switches, PIN diodes, Gallium Nitride Field Effect Transistors (GaNFET), and relays. A method for opening and closing the hybrid switches during transmit and receive operation is shown in FIG. 7. In this way, by adapting a conventional cable trap to include the pair of switches, the resonant baluns may be selectively connected during receive operation and disconnected during transmit operation. As a result, detuning in resonant baluns may be reduced, in addition, heating issues in the cables of the MRI system may be reduced, and distortion of MR signals in the MRI system may be mitigated.

Figure 1:
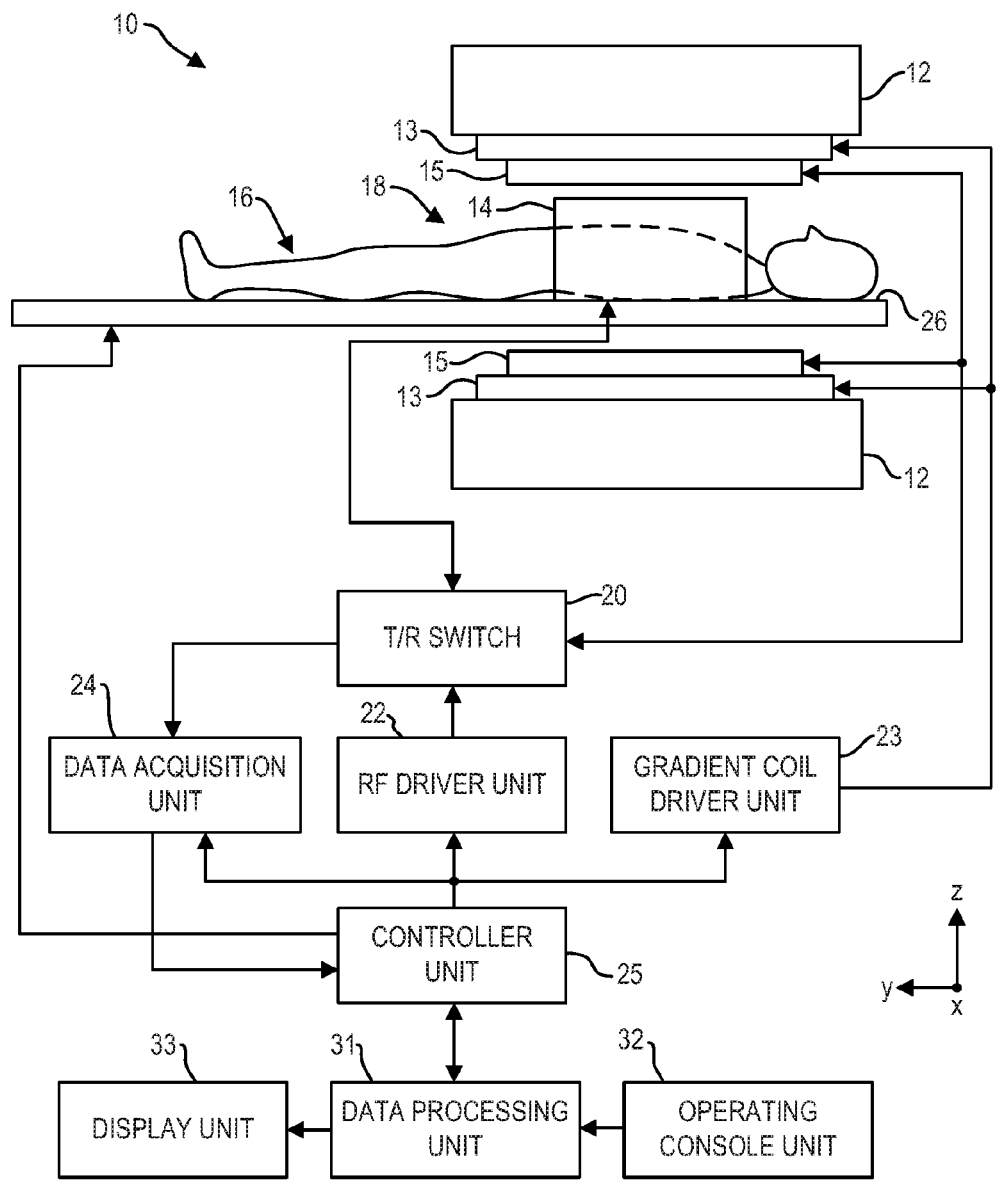
FIG. 1 is a block diagram of an MRI system according to an embodiment of the invention.

FIG. 1 illustrates a magnetic resonance imaging (MM) apparatus 10 that includes a magnetostatic field magnet unit 12, a gradient coil unit 13, an RF coil unit 14, an RF body or volume coil unit 15, a transmit/receive (T/R) switch 20, an RF driver unit 22, a gradient coil driver unit 23, a data acquisition unit 24, a controller unit 25, a patient table or bed 26, a data processing unit 31, an operating console unit 32, and a display unit 33. In one example, the RF coil 14 is a surface coil, which is a local coil that is typically placed proximate to the anatomy of interest of a subject 16. Herein, the RF body coil 15 is a transmit coil that transmits MR signals, and the local surface RF coil 14 receives the MR signals. As such, the transmit body coil (e.g., RF coil unit 15) and the surface receive coil (RF coil unit 14) are independent but electromagnetically coupled structures. The MR apparatus 10 transmits electromagnetic pulse signals to the subject 16 placed in an imaging space 18 with a magnetostatic field formed to perform a scan for obtaining magnetic resonance signals from the subject 16 to reconstruct an image of a slice of the subject 16 based on the magnetic resonance signals thus obtained by the scan.

The magnetostatic field magnet unit 12 includes, for example, typically an annular superconducting magnet, which is mounted within a toroidal vacuum vessel. The magnet defines a cylindrical space surrounding the subject 16, and generates a constant primary magnetostatic field along the Z direction of the cylinder space.

The MR apparatus 10 also includes the gradient coil unit 13 that generates a gradient magnetic field in the imaging space 18 so as to provide the magnetic resonance signals received by the RF coil unit 14 with three-dimensional positional information. The gradient coil unit 13 includes three gradient coil systems, each of which generates a gradient magnetic field, which inclines into one of three spatial axes perpendicular to each other, and generates a gradient field in each of frequency encoding direction, phase encoding direction, and slice selection direction in accordance with the imaging condition. More specifically, the gradient coil unit 13 applies a gradient field in the slice selection direction of the subject 16, to select the slice; and the RF coil unit 14 transmits an RF pulse to a selected slice of the subject 16 and excites it. The gradient coil unit 13 also applies a gradient field in the phase encoding direction of the subject 16 to phase encode the magnetic resonance signals from the slice excited by the RF pulse. The gradient coil unit 13 then applies a gradient field in the frequency encoding direction of the subject 16 to frequency encode the magnetic resonance signals from the slice excited by the RF pulse.

The RF coil unit 14 is disposed, for example, to enclose the region to be imaged of the subject 16. In some examples, the RF coil unit 14 may be referred to as the surface coil or the receive coil. In the static magnetic field space or imaging space 18 where a static magnetic field is formed by the magnetostatic field magnet unit 12, the RF coil unit 14 transmits, based on a control signal from the controller unit 25, an RF pulse that is an electromagnet wave to the subject 16 and thereby generates a high-frequency magnetic field. This excites a spin of protons in the slice to be imaged of the subject 16. The RF coil unit 14 receives, as a magnetic resonance signal, the electromagnetic wave generated when the proton spin thus excited in the slice to be imaged of the subject 16 returns into alignment with the initial magnetization vector. The RF coil unit 14 may transmit and receive an RF pulse using the same RF coil.

The RF body coil unit 15 is disposed, for example, to enclose the imaging space 18, and produces RF magnetic field pulses orthogonal to the main magnetic field produced by the magnetostatic field magnet unit 12 within the imaging space 18 to excite the nuclei. In contrast to the RF coil unit 14, which may be easily disconnected from the MR apparatus 10 and replaced with another RF coil unit, the RF body coil unit 15 is fixedly attached and connected to the MR apparatus 10. Furthermore, whereas local coils such as those comprising the RF coil unit 14 can transmit to or receive signals from only a localized region of the subject 16, the RF body coil unit 15 generally have a larger coverage area. The RF body coil unit may be used to transmit or receive signals to the whole body of the subject 16, for example. Using receive-only local coils and transmit body coils provides a uniform RF excitation and good image uniformity at the expense of high RF power deposited in the subject. For a transmit-receive local coil, the local coil provides the RF excitation to the region of interest and receives the MR signal, thereby decreasing the RF power deposited in the subject. It should be appreciated that the particular use of the RF coil unit 14 and/or the RF body coil unit 15 depends on the imaging application.

The T/R switch 20 can selectively electrically connect the RF body coil unit 15 to the data acquisition unit 24 when operating in receive mode, and to the RF driver unit 22 when operating in transmit mode. Similarly, the T/R switch 20 can selectively electrically connect the RF coil unit 14 to the data acquisition unit 24 when the RF coil unit 14 operates in receive mode, and to the RF driver unit 22 when operating in transmit mode. When the RF coil unit 14 and the RF body coil unit 15 are both used in a single scan, for example if the RF coil unit 14 is configured to receive MR signals and the RF body coil unit 15 is configured to transmit RF signals, then the T/R switch 20 may direct control signals from the RF driver unit 22 to the RF body coil unit 15 while directing received MR signals from the RF coil unit 14 to the data acquisition unit 24. The coils of the RF body coil unit 15 may be configured to operate in a transmit-only mode, a receive-only mode, or a transmit-receive mode. The coils of the local RF coil unit 14 may be configured to operate in a transmit-receive mode or a receive-only mode.

The RF driver unit 22 includes a gate modulator (not shown), an RF power amplifier (not shown), and an RF oscillator (not shown) that are used to drive the RF coil unit 14 and form a high-frequency magnetic field in the imaging space 18. The RF driver unit 22 modulates, based on a control signal from the controller unit 25 and using the gate modulator, the RF signal received from the RF oscillator into a signal of predetermined timing having a predetermined envelope. The RF signal modulated by the gate modulator is amplified by the RF power amplifier and then output to the RF coil unit 14.

The gradient coil driver unit 23 drives the gradient coil unit 13 based on a control signal from the controller unit 25 and thereby generates a gradient magnetic field in the imaging space 18. The gradient coil driver unit 23 includes three systems of driver circuits (not shown) corresponding to the three gradient coil systems included in the gradient coil unit 13.

The data acquisition unit 24 includes a preamplifier (not shown), a phase detector (not shown), and an analog/digital converter (not shown) used to acquire the magnetic resonance signals received by the RF coil unit 14. In the data acquisition unit 24, the phase detector phase detects, using the output from the RF oscillator of the RF driver unit 22 as a reference signal, the magnetic resonance signals received from the RF coil unit 14 and amplified by the preamplifier, and outputs the phase-detected analog magnetic resonance signals to the analog/digital converter for conversion into digital signals. The digital signals thus obtained are output to the data processing unit 31.

The MR apparatus 10 includes a table 26 for placing the subject 16 thereon. The subject 16 may be moved inside and outside the imaging space 18 by moving the table 26 based on control signals from the controller unit 25.

The controller unit 25 includes a computer and a recording medium on which a program to be executed by the computer is recorded. The program when executed by the computer causes various parts of the apparatus to carry out operations corresponding to pre-determined scanning. The recording medium may comprise, for example, a ROM, flexible disk, hard disk, optical disk, magneto-optical disk, CD-ROM, or non-volatile memory card. The controller unit 25 is connected to the operating console unit 32 and processes the operation signals input to the operating console unit 32 and furthermore controls the table 26, RF driver unit 22, gradient coil driver unit 23, and data acquisition unit 24 by outputting control signals to them. The controller unit 25 also controls, to obtain a desired image, the data processing unit 31 and the display unit 33 based on operation signals received from the operating console unit 32.

The operating console unit 32 includes user input devices such as a keyboard and a mouse. The operating console unit 32 is used by an operator, for example, to input such data as an imaging protocol and to set a region where an imaging sequence is to be executed. The data about the imaging protocol and the imaging sequence execution region are output to the controller unit 25.

The data processing unit 31 includes a computer and a recording medium on which a program to be executed by the computer to perform predetermined data processing is recorded. The data processing unit 31 is connected to the controller unit 25 and performs data processing based on control signals received from the controller unit 25. The data processing unit 31 is also connected to the data acquisition unit 24 and generates spectrum data by applying various image processing operations to the magnetic resonance signals output from the data acquisition unit 24.

The display unit 33 includes a display device and displays an image on the display screen of the display device based on control signals received from the controller unit 25. The display unit 33 displays, for example, an image regarding an input item about which the operator inputs operation data from the operating console unit 32. The display unit 33 also displays a slice image of the subject 16 generated by the data processing unit 31.

During a scan, coil-interfacing cables (not shown) may be used to transmit signals between the RF coils (e.g., RF coil unit 14 and RF coil unit 15) and other aspects of the processing system (e.g., data acquisition unit 24, controller unit 25, and so on), for example to control the RF coils and/or to receive information from the RF coils. As explained previously, the RF body coil 15 is a transmit coil that transmits MR signals, and the local surface RF coil 14 receives the MR signals. More generally, RF coils are used to transmit RF excitation signals ("transmit coil"), and to receive the RF signals emitted by an imaging subject ("receive coil"). In an example, the transmit and receive coils are a single mechanical and electrical structure or array of structures, with transmit/receive mode switchable by auxiliary circuitry. In other examples, the transmit body coil (e.g., RF coil unit 15) and the surface receive coil (RF coil unit 14) may be independent structures that are physically coupled to each other via a data acquisition unit or other processing unit. For enhanced image quality, however, it may be desirable to provide a receive coil that is mechanically and electrically isolated from the transmit coil. In such case it is highly desirable that the receive coil, in its receive mode, be electromagnetically coupled to and resonant with the RF pulse that was provided from the transmit coil. However, during transmit mode, it may be desirable that the receive coil is electromagnetically decoupled from and therefore not resonant with the transmit coil, during actual transmission of the RF pulse. Such decoupling averts a potential problem of noise produced within the auxiliary circuitry when the receive coil couples to the full power of the RF pulse. The inventors have recognized that it may be possible to electromagnetically couple the transmit coil to the receive coil through switches such as microelectromechanical systems (MEMS) switches, for example. In this way, it may be possible to electromagnetically decouple or disconnect the receive coil from the transmit coil, particularly during the transmit operation.

Figure 5:
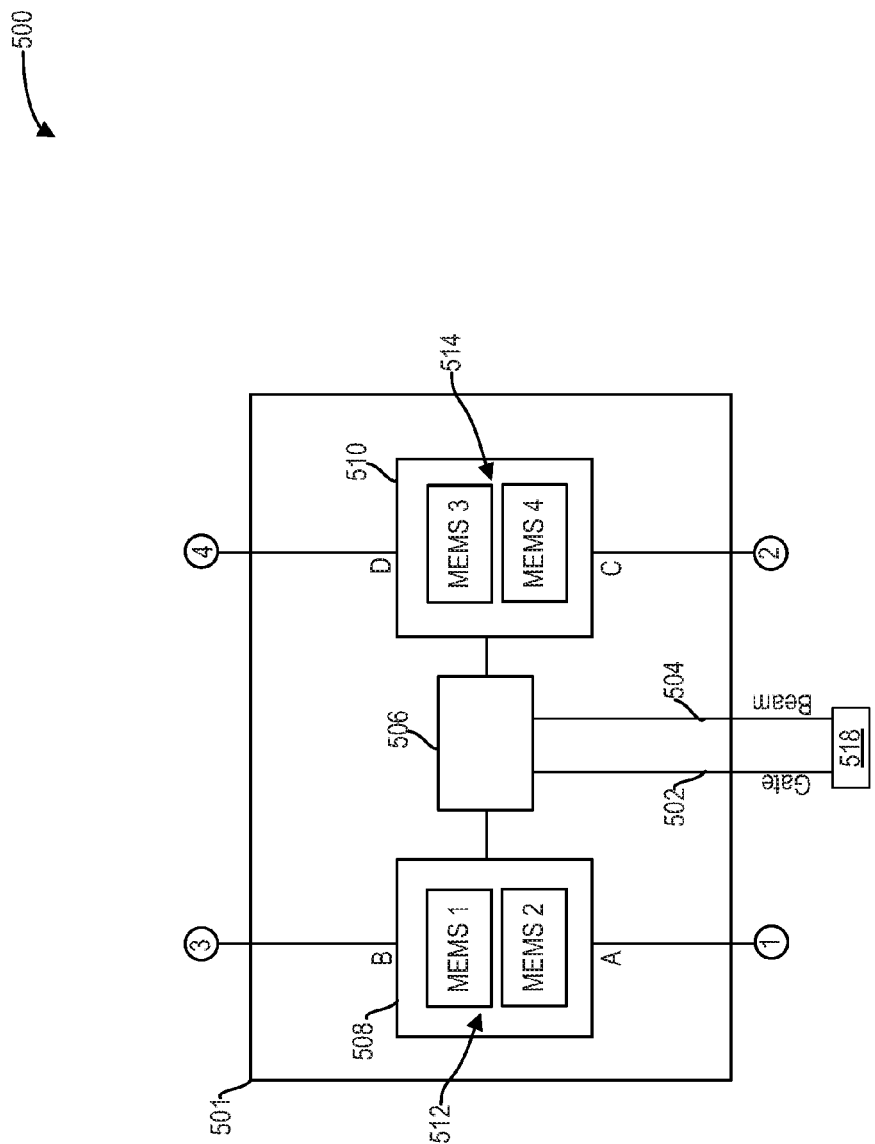
FIG. 5 is an example circuit diagram of a pair of MEMS devices, wherein each MEMS device includes a pair of MEMS switches in back-to-back configuration according to an embodiment of the invention.

The inventors have recognized that it may be possible to employ a plurality of MR compatible MEMS switches to decouple the coil during a transmit operation of the MR apparatus, and further disconnect the coil from the interfacing feedboard and cables. An example embodiment using a MEMS switch to rapidly decouple the receive coil from the transmit coil is shown in FIG. 2. An example embodiment using a plurality of MEMS switches to disconnect the coil from the feedboards and interfacing cables is shown in FIGS. 4 and 5. Disconnecting the coil from the feedboards may decouple the coil and additionally reduce Joule heating in the cables. As such, disconnecting the coil from the feedboards and cables may allow for a more general placement of the coil without interacting with the body coil as shown in FIG. 6B, for example. A hybrid balun/switch cable trap may be used to replace conventional tuned RF cable traps in MRI cabling in MRI systems as shown in FIGS. 9A-C. In one example, the switch may be a MEMS switch and the hybrid switch may be referred to as a hybrid balun/MEMS switch. In other examples, the hybrid switch may include one or more of GaNFET, PIN diode, relays, and the like. As such, the hybrid switch cable trap may include two switches coupled to either ends of the balun. By including such hybrid traps, cable bulk and cost may be reduced. In addition, common mode current reduction may be increased. The hybrid switch may be applied to conventional and coaxial structures of ribbon cabling.

Turning now to FIG. 2, a schematic view 200 of a RF coil 202 coupled to a processing system 206 via a MEMS device 208 and a coil-interfacing cable 218 is shown. The RF coil 202 may be a multi-channel coil. In one example, the RF coil 202 may be a surface receive coil, which may be single- or multi-channel. The RF coil 202 is one non-limiting example of RF coil 14 of FIG. 1 and as such may operate at one or more frequencies in the MR apparatus 10.

Coil-interfacing cables 218 may be used to transmit signals between the RF coils and other aspects of the processing system, for example to control the RF coils and/or to receive information from the RF coils. The coil-interfacing cables may be disposed within the bore or imaging space of the MR apparatus (such as MR apparatus 10 of FIG. 1) and subjected to electro-magnetic fields produced and used by the MR apparatus. In MR systems, coil-interfacing cables 218 may support transmitter-driven common-mode currents, which may in turn create field distortions and/or unpredictable heating of components. Typically, common-mode currents are blocked by using baluns. Baluns or common-mode traps provide high common-mode impedances, which in turn reduces the effect of transmitter-driven currents. As an example, coupling electronics or circuit 204 including baluns may be coupled to the RF coil 202. Herein, the circuit 204 may include an input balun 210, a matching circuit 212, a preamplifier 214, and an output balun 216.

Typically, the RF coil 202 in its receive mode may be coupled to a body coil (such as RF body coil unit 15) in order to receive echoes of the RF pulse transmitted during the transmit mode. As mentioned earlier, if the RF coil 202 is not used for transmission, then it may be necessary to decouple the RF coil 202 from the body coil while the body coil is transmitting the RF pulse. Traditionally, the decoupling of the receive coil from the transmit coil is achieved using resonance circuits and PIN diodes. Herein, the diodes may activate detuning circuits operatively connected to the RF coil 202. However, diode-activated detuning circuits may be slow and may cause loss in signals. Instead of using diode activated detuning circuits, MEMS device 208 may be used to decouple the receive coil from the transmit coil as discussed below. Herein, the MEMS device 208 may include a pair of MEMS switches in a back-to-back configuration as shown in FIG. 3.

Turning now to FIG. 3, an example MEMS device 300 is shown. MEMS device 300 is one non-limiting example of MEMS device 208 of FIG. 2, and as such may be coupled to an RF coil (such as RF coil 202 of FIG. 2). The MEMS device 300 includes at least two MEMS switches, and as shown includes a first MEMS switch 310 and a second MEMS switch 312 coupled in a "back-to-back" configuration. The term "back-to-back" refers to specific MEMS configurations in which the respective actuating elements of the first MEMS switch 310 and the second MEMS switch 312 are coupled together at corresponding anchors and gate. The MEMS device 300 may be coupled across terminals of a RF coil (such as terminals of RF coil 202 of FIG. 2). During a transmit operation, the MEMS device 300 may be operated such that both the first MEM switch 310 and the second MEMS switch 312 may be in open states, and during a receive operation, both the first MEMS switch 310 and the second MEMS switch 312 may be in closed states as discussed below.

Each of the first MEMS switch 310 and the second MEMS switch 312 of the MEMS device 300 are electrically coupled to a passive bypass circuit 332. The MEMS device 300 includes a single driver or gate 318 that controls each of the first MEMS switch 310 and the second MEMS switch 312. The passive bypass circuit 332 includes a first resistor 334 coupled across the first MEMS switch 310 and a second resistor 336 coupled across the second MEMS switch 312. An example value of resistance of the first and second resistor is 100K ohm. It should be understood that the passive elements in the passive bypass circuit in this example are shown as resistive elements 334, 336; however, other passive elements including inductors may be used. The passive bypass circuit 332 may shield the MEMS switches 310 and 312 by receiving at least a portion of electrical energy transferred across contacts of the MEMS switches 310 and 312 during transition from open to closed or from closed to open states, for example.

The first MEMS switch 310 includes a first beam element 320, a first contact 324, and a first gate 322. Herein, the first beam element 320 may contact the first contact 324 when an actuation voltage is applied to the first gate 322. When the first beam element 320 is in contact with the first contact 324, the first MEMS switch 310 may be in closed state. When no actuation voltage is applied to the first gate 322, the first MEMS switch 310 may be in open state wherein the first beam element 320 may not be in electrical contact with the first contact 324. Thus, the first gate 322 influences whether or not the first beam element 320 makes electrical connection to the first contact 324, and thereby controls whether the first MEMS switch 310 is in a closed or an open state.

Similar to the first MEMS switch 310, the second MEMS switch 312 includes a second beam element 326, a second contact 330, and a second gate 328. The second beam element 326 may contact the second contact 330 based on an actuation voltage that is applied to the second gate 328. The first gate 322 of the first MEMS switch 310 and the second gate 328 of the second MEMS switch 312 may be electrically coupled together to form a common gate or driver 318. It may be possible to employ a single (or common) actuation voltage to control the actuation of both the first and the second MEMS switches as described below.

As an example, a switch controller 302 may apply an actuation voltage to the driver 318 to switch the MEMS device 300 from an open state to a closed state. Likewise, the switch controller 302 may cease the application of the actuation voltage to the driver 318 to switch the MEMS device 300 from a closed to an open state. For example, the switch controller 302 may apply an actuation voltage to the driver 318, and may bias each of the first beam element 320 and the second beam element 326 in such a way that the first beam element 320 may contact the first contact 324 and the second beam element 326 may contact the second contact 330. Thus, current may flow from the first and second beam elements to the respective first and second contact elements, and MEMS device 300 may be in a "closed" state. Herein, the actuation voltage is equally applied to the first gate 322 and the second gate 328. In a similar way, when the switch controller 302 does not apply an actuation voltage to the driver 318, the first and the second beam elements 320 and 326 may be spaced apart from the first and the second contacts 324 and 330. Thus, the MEMS device 300 may be in an "open" state. The actuation voltage may be a single voltage value (e.g., 80V), or a range of voltage values (e.g., 10-100V). In an example configuration, when the switch controller 302 applies a voltage greater than a threshold voltage to the driver 318, the beam elements of each of the first and the second MEMS switch may be electrically coupled to the respective first and second contacts, thereby closing the MEMS device 300. When the switch controller applies a voltage, less than the threshold voltage (e.g., threshold voltage=50V), the beam elements of each of the first and the second MEMS switches may be electrically decoupled from the respective first and second contacts, thereby opening the MEMS device 300. In this way, the MEMS device 300 including a pair of MEMS switches in back-to-back configuration may be used to coupled and decouple the receive RF coil from the transmit RF coil, for example. As such, the MEMS switches may be in open state providing coil decoupling when the receive RF coil is unpowered (or the receive coil being unplugged, for example). As mentioned earlier, the coupling and decoupling of receive and transmit coils are typically achieved using resonance circuits and diodes. However, these resonance circuits and diodes are slow. Specifically, the switch turn-off time can be slow if larger amounts of charge are stored in the resonance circuits and diodes to carry high RF currents. Typically, to discharge or remove that charge, the resonance circuits and diodes may take longer than 10 μsec. By replacing these circuits and diodes with the MEMS device, it may be possible to transition the RF coils from a coupled to a decoupled state and vice versa at a faster rate. As an example, the time that the MEMS device takes to transition from a closed to an open state is less than 1 μsec and from open to closed state is about 4 μsec. Another advantage of using the MEMS devices to decouple the RF coils is that the MEMS devices are electrostatically driven, and thus are low power devices, which can operate in the RF ranges.

In one example, the back-to-back MEMS are configured such that the actuating elements are mechanically coupled to each other. By way of example, during the transmit operation, the switch controller 302 may switch the MEMS device 300 to the open state to decouple the RF coil from an RF receiver before selective application of RF transmit signals to a patient. Further, during the receive operation, the switch controller 302 may switch the MEMS device 300 to the closed state for coupling the RF coil to the RF receiver to enable detection of the MR signals corresponding to the resulting excitation in the patient. The detected MR signals, in turn, may be communicated to a processing system (not shown in FIG. 3) coupled to the MR apparatus (such as MR apparatus 10 shown in FIG. 1), for further processing, image reconstruction and/or display. The MEMS device 300, thus, may be integrated into the MR apparatus for efficiently decoupling RF transmit and/or receive coils during MR transmit and/or receive operations. In some example embodiments, additional inductive decoupling elements may be used along with the MEMS switches to decouple the receive and the transmit coils, during transmit operation. During transmit, when larger fields are transmitted, MEMS switches open up the decouple loop by breaking open the loop. Thus, when a larger field is transmitted, the loop is disabled or opened up or may be allowed to conduct in with a particular impedance or inductive impedance is one example.

Thus, by including MEMS switches to decouple the receive coil from the transmit coil in the MR apparatus, currents in the loop may be minimized during transmit operation, for example. As such, the MEMS switches may be in open state providing coil decoupling when the MR receive coil is unpowered (or unplugged, for example). Returning to FIG. 2, the MEMS device 208 including a pair of MEMS switches (as described with reference to FIG. 3), may be used to couple and decouple the RF coil 202 from the coil-interfacing cables 218. As shown in view 200, the circuit 204 including baluns may additionally be coupled to the RF coil 202. The RF coil 202 may be electrically coupled to the processing system 206 through one or more of the MEMS device 208 and the circuit 204. The processing system 206 may include one or more of drivers, data acquisition systems, feedboards, controller unit, data processing unit, and the like.

The circuit 204 may be a coupling circuit and may include several baluns, preamplifiers, and so on. In one example embodiment, the circuit 204 may include an input balun 210 and an output balun 216. Typically, the input and the output baluns are resonance circuits that cause currents to be equal in magnitude, but opposite in phase, resulting in a zero imbalance current. As such, baluns provide high common-mode impedances, which may be utilized to mitigate the effect of transmitter-driven common-mode currents. Examples of baluns include solenoid baluns, transformer-like baluns, bazooka baluns, lattice baluns, and the like. Typically, the structures of the input and the output baluns may be the same, although the output baluns tend to be more robust. In application, the input baluns may be generally used to break the loop from coil element to coil element during the receive state. The output baluns stop the common mode flowing down the interfacing cables during transmit state.

Baluns present low impedance to the signal current that is in differential mode, and thus allows DC coupling. However, for common-mode current, the baluns act as a high impedance choke. The common-mode current (which is the algebraic sum or the net current in the cables) generates unnecessary coupling and heating of the RF coils and cables. Baluns positioned at an appropriate boundary between the RF coil and the interfacing cables may be necessary to reduce common-mode currents. In addition, baluns positioned too close to each other on a cable may become coupled due to fringe magnetic fields, thereby resulting in a detuning of the baluns, which may adversely affect the functioning of the baluns. Thus, the baluns may require additional tuning which may in turn add to the cost of the MRI system. Decoupling the RF coil MEMS switches as described above may not completely block the common-mode currents. The finite Q (or quality factor) of the resonant balun, plus any tuning imperfections, will lower the common mode blocking impedance, for example. Herein, the Q factor of the resonant baluns is a measure of the quality of the resonant circuits. More formally, Q is the ratio of power stored to power dissipated in the circuit reactance and resistance, respectively.

The inventors have recognized that it may be possible to operate a plurality of devices as common-mode chokes. For example, the devices may include switches and/or relays such as GaNFET, PIN diodes, MEMS devices, and the like. Herein, the plurality of devices are coupled across the terminals of the RF coil and serve to completely disconnect the RF coil from the interfacing feedboards and cables, as shown in FIG. 4. In some example embodiments, by using the plurality of devices as common-mode chokes, output baluns may be eliminated thereby simplifying the coupling circuit. In addition, the inventors have recognized that it is possible to include a hybrid switch cable trap, as shown in FIGS. 8A-B, 9A-C, to further simplify the cabling system and reduce cable bulk in the MM systems.

Turning now to FIG. 4, a schematic view 400 of an RF coil 402 coupled to a processing system 414 via each of a first and a second device is shown. Herein, the RF coil 402 may be an example of RF coil 202 of FIG. 2 and/or RF coil 14 of FIG. 1. In one example, the RF coil 402 may be a surface receive coil, which may be single- or multi-channel. Each terminal of the RF coil 402 may be coupled to a differential preamplifier 412 through a first device 406 and a second device 408 (together referred to as a pair of devices 416) respectively. Herein, the pair of devices 416 may be used to block common-mode currents by selectively disconnecting the terminals of the RF coil during transmit, thus operating like an open circuit. As an example, the first device 406 may include one or more switches 407 coupled via a first circuit 411. Likewise, the second device 408 may include one or more switches 409 coupled via a second circuit 413. In the illustrated example, two switches 407 are included in the first device 406 and two switches 409 are included in the second device 408. The first and the second circuit may include coupling components such as resistors, capacitors, and the like (explained in detail with reference to FIG. 5). In one example, the switches 407 and 409 may include one or more of relays, GaNFET, PIN diodes, and MEMS devices, or any combinations thereof. In one example, the first device 406 and the second device 408 may be housed within a single package. Herein, the switches 407 and 409, and the circuits 411 and 413 are formed within a unitary construction or package. Specifically, the switches 407 and 409, and the circuits 411 and 413 are in a single housing. In the example wherein the switches 407 and 409 include MEMS switches, the first and the second circuit 411 and 413 may include resistors (such as first resistor 334 and second resistor 336 shown in FIG. 3) to couple the MEMS switches in back-to-back configuration.

The pair of devices 416 may be operated to disconnect and isolate the RF coil 402 during transmit operation. In the case of the pair of devices 416 having MEMS switches, during transmit operation, the MEMS switches may act as floating arrays, wherein the beam element of each of the MEMS switch is disconnected from the respective contact of the MEMS switch. Specifically, during transmit operation, the MEMS switches may be in an open state providing coil decoupling when the MR surface coil (e.g., receive RF coil) is unpowered (or unplugged).

As described previously, the switches may include one or more of MEMS switches, GaNFET switches, relays, and the like. In the case of MEMS switches, an actuation voltage applied between a gate and a beam electrode of the MEMS switches may close the switch. However, when the actuation voltage is not applied between the gate and the beam electrode, the MEMS switches may be open. In the case of GaNFET switches, an actuation voltage or bias applied to a gate relative to a source of the GaNFET switch may close the switch; and when the bias is removed, the switch may be opened. In case of relays, which are electrically operated switches, a control signal or actuation voltage given to the relay may be able to control the opening and closing of the relay switch.

For example, terminal 1 of the RF coil is coupled to the first device 406 (herein also referred to as device 1), and likewise, terminal 2 of the RF coil is coupled to the second device 408 (herein also referred to as device 2). Specifically, terminal 1 of the RF coil 402 is coupled to a first terminal of the first device 406. A second, different terminal of the first device 406 is coupled to terminal 3 of the coil-interfacing cable 420. Likewise, terminal 2 of the RF coil 402 is coupled to a first terminal of the second device 408, and a second, different terminal of the device 408 is coupled to a terminal 4 of the coil-interfacing cables 420. Optionally, an inductive coupling element 404 may also be coupled across the terminals 1 and 2 of the RF coil 402, and an inductive coupling element 405 may be coupled across the wires of the coil-interfacing cable 420. As an example, the coupling elements may include an inductor, a capacitor, and the like. It may be appreciated that the magnitude of the current flowing through each of the terminals of the device may be within 10% of the current through the other terminal of the device. As such, the magnitude of current flowing through all four terminals of the first and the second devices may be within 10% of each other.

When the two switches of the first device 406 are closed, then terminal 1 of the RF coil is electrically connected to terminal 3 of coil-interfacing cables 420 and when the two switches of the second device 408 are closed, then terminal 2 of the RF coil is electrically connected to terminal 4 of the coil-interfacing cables 420. As such, the coil-interfacing cables couple the RF coil to the data acquisition elements (or processing system 414) through one or more of coupling circuits, and preamplifiers, resonance circuits, and the like. Herein, the devices coupled to the coil-interfacing cables 420 couple one or more RF terminals to one or more data acquisition elements. Specifically, each terminal of the device is electrically coupled to one or more RF coil elements and wherein one or more terminals of the devices is electrically coupled to one or more data acquisition elements. However, when the two switches 407 of the first device 406 are open, then the RF terminal 1 is electrically disconnected from terminal 3 of coil-interfacing cables 420 (FIG. 4). Similarly, when the two switches 409 of the second device 408 are open, then the RF terminal 2 is electrically disconnected from the terminal 4 of the coil-interfacing cables 420. A switch controller 418 may actuate switches to selectively connect and disconnect the RF coil 402 from one or more of the differential preamplifier 412, the processing system 414, and the coil-interfacing cables 420.

The first and second devices 406 and 408 may each include MEMS devices with pairs of MEMS switches as shown in FIG. 5. Herein, each MEMS device includes two MEMS switches in a back-to-back configuration as explained with reference to FIG. 3.

FIG. 5 shows an example block diagram 500 of a pair of MEMS devices 501. The pair of MEMS devices 501 includes a first electric circuit 508 having a first MEMS switch (MEMS 1) and a second MEMS switch (MEMS 2) coupled to a second electric circuit 510 having a third MEMS switch (MEMS 3) and a fourth MEMS switch (MEMS 4). The first electric circuit 508 may be an example of the first circuit 411 shown in FIG. 4, and the second electric circuit 508 may be an example of the second circuit 413 shown in FIG. 4.

In one example, the first electric circuit 508 may electrically couple both MEMS 1 and MEMS 2 using coupling elements (e.g., resistors, capacitors, and the like). Likewise, the second electric circuit 510 may include coupling elements (e.g., resistors) that electrically couple MEMS 3 and MEMS 4. Herein, the first electric circuit 508 and the second electric circuit 510 may be in a single housing (e.g., formed as a single package) that may be coupled to RF coils of MRI systems, specifically to the terminals of the RF coil as described below to disconnect and isolate the RF coils during specific operation of the MRI system. As such, MEMS 1 and MEMS 2 are in a back-to-back configuration, and MEMS 3 and MEMS 4 are in back-to-back configuration, as described with reference to FIG. 3. MEMS 1 and MEMS 2 together form a first MEMS device 512, and MEMS 3 and MEMS 4 form a second MEMS device 514. The first MEMS device 512 may be an example of the first device 406 shown in FIG. 4, and the second MEMS device may be an example of the second device 408 shown in FIG. 4.

When the two MEMS switches of the first MEMS device 512 are open, then the RF terminal 1 is electrically disconnected from terminal 3 of the coil-interfacing cables 420 (FIG. 4). Similarly, when the two MEMS switches of the second MEMS device 514 are open, then the RF terminal 2 is electrically disconnected from the terminal 4 of the coil-interfacing cables 420 (FIG. 4). Further, each of the MEMS devices may be coupled together via a coupling circuit 506 that may include coupling and gating electronics as described below. Thus, the coupling circuit 506 electrically couples two sets of MEMS in back-to-back configuration. In one example, the first and the second MEMS device including the coupling circuit 506 may be housed together in a single package.

MEMS 1 and MEMS 2 of the first MEMS device 512 are MEMS switches and may include contact elements, beam elements, and a gate as explained previously with reference to FIG. 3. Likewise, MEMS 3 and MEMS 4 of the second MEMS device 514 may also include contact elements, beam elements, and a gate. MEMS 1 and MEMS 2 may be coupled in back-to-back configuration using additional coupling elements such as resistors and capacitors of the first electric circuit 508. In one example, the resistors may be 100 Kohm resistors, and the capacitors may be 1 pF. Similarly, MEMS 3 and MEMS 4 of the second MEMS device 514 may be coupled using additional coupling elements of the second electric circuit 510. MEMS 1 and MEMS 2 of the first MEMS device 512 may be coupled to MEMS 3 and MEMS 4 of the second MEMS device via a coupling circuit 506. The pair of MEMS devices 501 may be controlled by a switch controller 518. The switch controller 518 may be an example of switch controller 302 of FIG. 3 and/or switch controller 418 of FIG. 4.

As an example, a gate of the first MEMS device 512 may be coupled to a gate 502 of the pair of MEMS devices 501 via a resistor (100 Kohm, for example) of the coupling circuit 506. Likewise, a first beam element and a second beam element of the first MEMS device 512 may each be coupled to a beam electrode 504 of the pair of MEMS devices 501 via a resistor (100 Kohm, for example) of the coupling circuit 506. In a similar way, a gate of the second MEMS device 514 may be coupled to the gate 502 via a resistor of the coupling circuit 506, and a first beam element and a second beam element of the second MEMS device 514 may each be coupled to the beam electrode 504 via a resistor of the coupling circuit 506. In one example, the resistors of the coupling circuit 506 may be 100 Kohm resistors. The gate 502 and the beam electrode 504 may include additional coupling resistors and capacitors.

When the switch controller 518 applies a common actuation voltage between the gate 502 and the beam electrode 504, the actuation voltage may drive each of the MEMS switches. Herein, the actuation voltage may enable the first and the second beam elements of the first MEMS device 512 to contact respective first and second contact elements of the first MEMS device 512. In addition, the same actuation voltage applied between the gate 502 and the beam electrode 504 may additionally enable the first and the second beam elements of the second MEMS device 514 to contact respective first and second contact elements of the second MEMS device 514. In this way, the switch controller 518 may concurrently close all the MEMS switches with a common actuation voltage. In a similar way, when the controller stops applying the actuation voltage between the gate 502 and the beam electrode 504, the first and the second beam elements of the first MEMS device 512 may be mechanically and electrically disconnected from the respective first and second contact elements of the first MEMS device 512. Additionally, the first and the second beam elements of the second MEMS device 514 may be mechanically and electrically disconnected from the respective first and second contact elements of the second MEMS device 514 when the controller stops applying the actuation voltage between the gate 502 and the beam electrode 504. In this way, the switch controller 518 may apply a common actuation voltage to simultaneously close all the MEMS switches and cease or stop the application of the actuation voltage to simultaneously open all the MEMS switches.

As an example, the switch controller 518 may apply an actuation voltage (e.g., −80V) between the gate 502 and the beam electrode 504 to bias the beam elements of the first MEMS device 512. Biasing the beam elements of the first MEMS device 512 includes biasing both the first beam element and the second beam element of the switches of the first MEMS device 512. In addition, the beam elements of the second MEMS device 514 are also biased when the switch controller applies the actuation voltage between the gate 502 and beam electrode 504. Biasing the beam elements of the second MEMS device 514 includes biasing both the first beam element and the second beam element of the switches of the second MEMS device 514.

Thus, when the actuation voltage is applied by the switch controller 518, the beam elements of the switches of the first MEMS device 512 may contact the corresponding contact elements of the MEMS device 512, thereby closing both the switches of the MEMS device 512. Likewise, the beam elements of the switches of the second MEMS device 514 additionally contact the respective contact elements, thereby closing both the switches of the second MEMS device 514. Consequently, both the pairs of the MEMS devices are closed.

The first and the second beam elements of the first MEMS device 512 may together form terminal A of the first MEMS device 512, and the first and the second beam elements of the second MEMS device 514 may together form terminal C of the second MEMS device 514. Herein, terminal A of the first MEMS device 512 may be electrically coupled to terminal 1 of the RF coil 402 of FIG. 4, and terminal C of the second MEMS device 514 may be electrically coupled to terminal 2 of the RF coil 402 of FIG. 4. The first and the second contacts of the first MEMS device 512 may be coupled through coupling elements (e.g., capacitors), and form terminal B. Terminal B of the first MEMS device 512 may further be electrically coupled to terminal 3 of coil-interfacing cables 420 of FIG. 4. Likewise, terminal D that is formed by coupling the first and the second contact elements of the second MEMS device 514 may be electrically coupled to terminal 4 of coil-interfacing cables 420 of FIG. 4. When the switches of the first MEMS device 512 are closed (e.g., when controller 518 applies actuation voltage to the gate and beam), terminal A and terminal B are electrically coupled, hence electrically coupling terminal 1 of the RF coil 402 to terminal 3 of the coil-interfacing cables 420. Thus, current may flow from terminal 1 of the RF coil 402 into the terminal 3 of the coil-interfacing cables 420. Similarly, when the switches of the second MEMS device 514 are closed, terminal C is electrically coupled to terminal D, thus electrically coupling terminal 2 of the RF coil 402 to terminal 4 of the coil-interfacing cables 420. Thus, current may flow from terminal 2 of the RF coil 402 into the terminal 4 of the coil-interfacing cables 420.

However, when the switch controller 518 does not apply an actuation voltage (or ceases application of actuation voltage, for example) to the gate 502 and the beam electrode 504, the first and the second beam elements of each of the MEMS switches may be spaced apart from the respective first and the second contact elements. Thus, each of the MEMS devices 512 and 514 may be in an "open" state. Thus, terminal A may be disconnected from terminal B of the first MEMS device 512, and likewise, terminal C may be disconnected from terminal D of the second MEMS device 514. This in turn may result in isolating each of the terminals 1 and 2 of the RF coil from the corresponding terminals 3 and 4 of the coil-interfacing cables. In one example, the capacitive isolation across the MEMS switch is between 0.3 and 1 pF and the passive resistors provide 200K total resistance across the switch. The advantage of including the passive elements in the MEMS switches is that excessive current may not be leaked though the actuation connections. Thus, terminal 1 of the RF coil 402 may be isolated from terminal 3 of the coil-interfacing cables 420, and terminal 2 of the RF coil 402 may be isolated from terminal 4 of the coil-interfacing cables 420. In this way, the pair of MEMS devices 501 each including a pair of MEMS switches in a back-to-back configuration may be used to selectively connect and disconnect the receive RF coil from the transmit RF coil, for example. The advantages of using the MEMS device as RF switches is that the MEMS devices are low power devices which can provide high RF isolation when open and low insertion loss when closed The PIN diode based switch may require tens of milliwatts of power to operate in the resonant blocking state, for example. Disconnecting the terminals of the RF coil from the terminals of the coil-interfacing cables may also decouple the receive RF coil from the transmit RF coil and vice versa. Thus, during transmit operation, when larger fields are transmitted, the pairs of MEMS switches decouple the RF coil/loop by disconnecting the loop.

It may be appreciated that coupling the pair of MEMS switches across each of the RF coil 402 terminals has several advantages. As explained above, by opening the MEMS switches of each MEMS device during transmit operation, each terminal of the RF coil 402 may be disconnected with the coil-interfacing cables 420 and the feedboards (including the differential preamplifier 412 and the processing system 414, for example). In this way, the receive coil may be completely isolated or disconnected from the transmit coil.

As another advantage, additional resonance circuits may be reduced. Instead of using additional baluns as common-mode chokes to block the common-mode currents flowing along the wires of the coil-interfacing cables 420, it may be possible to use the pair of MEMS devices 501 to act as the common-mode choke. Herein, when the pair of switches MEMS 1 and MEMS 2 of the first MEMS device 512 are open, the terminal 1 of the RF coil 402 is electrically disconnected or isolated from terminal 3 of coil-interfacing cables 420. Likewise, when the pair of switches MEMS 3 and MEMS 4 of the second MEMS device 514 are open, the terminal 2 of the RF coil 402 is electrically disconnected or isolated from terminal 4 of coil-interfacing cables 420. Thus, when all four MEMS switches are open, there is high isolation between the RF coil 402 and the coil-interfacing cables 420, and high isolation between the RF coil and the feedboards, and thus, common-mode currents are blocked from flowing into the preamplifier 412, for example. In this way, the pair of MEMS devices 501 having a plurality of MEMS switches may block the common-mode currents without the need for additional resonance circuits. As such, the MEMS switches have reduced interaction with the transmitting field, and thus have reduced detuning effects on the transmitting system, for example. In one example embodiment, the size of the MEMS switches may be smaller in size when compared to conventional baluns, and may additionally be packaged closer together, to form a single common-mode blocker. In some examples, packaging several MEMS switches together may eliminate the need for additional output baluns. The differential preamplifier 412 (shown in FIG. 4) may perform additional isolation of the currents flowing through the coil-interfacing cables 420.

Using MEMS devices as common-mode choke to block the common-mode currents may reduce preamplifier saturation, for example. Traditionally, in silent imaging, the preamplifier may be easily saturated, and recovery from the saturation may be relatively lengthy (e.g., on the order of tens of μsec). However, when the MEMS devices are used as common-mode chokes, the preamplifier may not be saturated. Since the preamplifier is not saturated, the additional time loss due to recovery from saturation in traditional set-ups may be avoided when MEMS switches are used as common-mode chokes.

As a common-mode blocker, the pair of MEMS devices 501 may be positioned at the input of the differential preamplifier 412 as shown in FIG. 4. However, it may be possible to position the pair of devices 416 at locations along coil-interfacing cables at the output of the differential preamplifier as shown in FIG. 6.

As described earlier, the RF coil assembly of an MRI system includes a transmit coil to create the B1 field and a receive coil used in conjunction with the transmit coil to detect or receive the signals from the excited spins in the imaged object. Typically, each receive coil of the RF coil assembly is connected to the receive RF coil of the MM system via a coaxial transmission line or cable. Because of the proximity of coaxial cables for the receive coils with respect to one another, ghosting and signal-to-noise (SNR) related problems can occur. Traditionally baluns are positioned along coil-interfacing cables to block common-mode currents as shown in FIG. 6A. In FIG. 6A, a schematic view 600 of baluns 616 positioned along coil-interfacing cables 614 is shown. Herein, an RF coil 604 is positioned within a body coil 602. The RF coil 604 is coupled to a preamplifier 606, and further coupled to coil-interfacing cables 614 that couple the RF coil 604 to processing systems of the MR apparatus (not shown).

Typically, baluns 616 are coupled to the coil-interfacing cables 614 at high current locations. A standing wave current distribution 610 shows the distribution of the current 612 as it travels along the coil-interfacing cables 614. As an example, the standing wave current distribution 610 shows the current being high at two locations (marked by vertical dashed lines 613). The baluns 616 are typically placed in the high current locations, and the baluns 616 provide high impedance for the common-mode currents. However, the RF coil 604 is generally placed arbitrarily inside the body coil 602. Thus, the high current locations may not be known, and positioning the baluns at appropriate locations may be difficult. However, by using switches 620 as explained previously, the devices 608 may be positioned anywhere along the coil-interfacing cables 614. An example configuration is shown in FIG. 6B. As such, components previously introduced in FIG. 6A are numbered similarly in FIG. 6B.

Turning now to FIG. 6B, an example schematic view 618 shows possible locations for positioning devices 608 along a receive path 624. The device 608 may include a plurality of switches. The switches may include one or more of GaNFET, PIN diodes, MEMS, and relays. The receive path 624 may include one or more of coupling circuits, processing system, feedboards, coil-interfacing cables, and the like. The MEMS devices 608 may be non-limiting examples of the MEMS devices 416 shown in FIGS. 4 and 5. In one example, the devices 608 may include a first switch 620 coupled across one of the wires (613) of coil-interfacing cables 614, and additionally include a second switch 622 coupled to the other wire (615) of the coil-interfacing cables 614. In one example, the device 608 may be a MEMS device (such as MEMS device 512 and 514 of FIG. 5) and the switches 620 and 622 may include pairs of MEMS switches in back-to-back configuration (as explained previously with reference to FIG. 5). As such the wire 613 may be a signal line and the wire 615 may be a ground line. Herein, the coil-interfacing cables 614 couple the RF coil 604 to one or more of a transmit coil, processing systems, coupling circuits, feedboards, and the like. Optionally, the devices 608 may be coupled across different terminals of the RF coil 604.

In the example where the device 608 is a MEMS device, the MEMS switches of the MEMS device may be actuated by a common actuation voltage. The operation of the MEMS devices may be controlled by a switch controller 625. The switch controller 625 is one non-limiting example of switch controller 418 of FIG. 4 and switch controller 518 of FIG. 5.

When the switch controller 625 applies an actuation voltage to the devices 608, the same actuation voltage is applied across each of the first and the second switches 620 and 622. As a result, all the switches may be closed, and current may be transmitted along the coil-interfacing cable 614. When the devices 608 are coupled across the terminals of the RF coil 604, closing the switches result in connecting the RF coil to the pre-amplifier 606 in the receive path. Thus, the RF coil 604 may be able to receive MR signals from the transmit coil.

When an actuation voltage is not applied to both the first and the second switches 620 and 622, all the switches may be in open state, thereby blocking common-mode currents from being transmitted along the coil-interfacing cables 614. By opening all the switches, each of the wires of the coil-interfacing cables 614 may be disconnected from the coil and the feedboards, thus opening the circuit to block common-mode currents. In this way, circulating currents flowing in the coil-interfacing cables may be reduced, particularly during transmit operation.

In one example configuration, a hybrid cable trap assembly may be used to block common mode currents and additionally serve to isolate the receive coil during transmit operation as described below with reference to FIGS. 8A and 8B. The hybrid assembly of cable trap including switches and baluns (also referred to as hybrid switch) may be formed by adapting a conventional balun or cable trap. As such, this reduces heating in the coils, and further reduces distortion of magnetic fields in the MR imaging systems caused by the currents in the RF coil elements as described below.

Figure 8A:
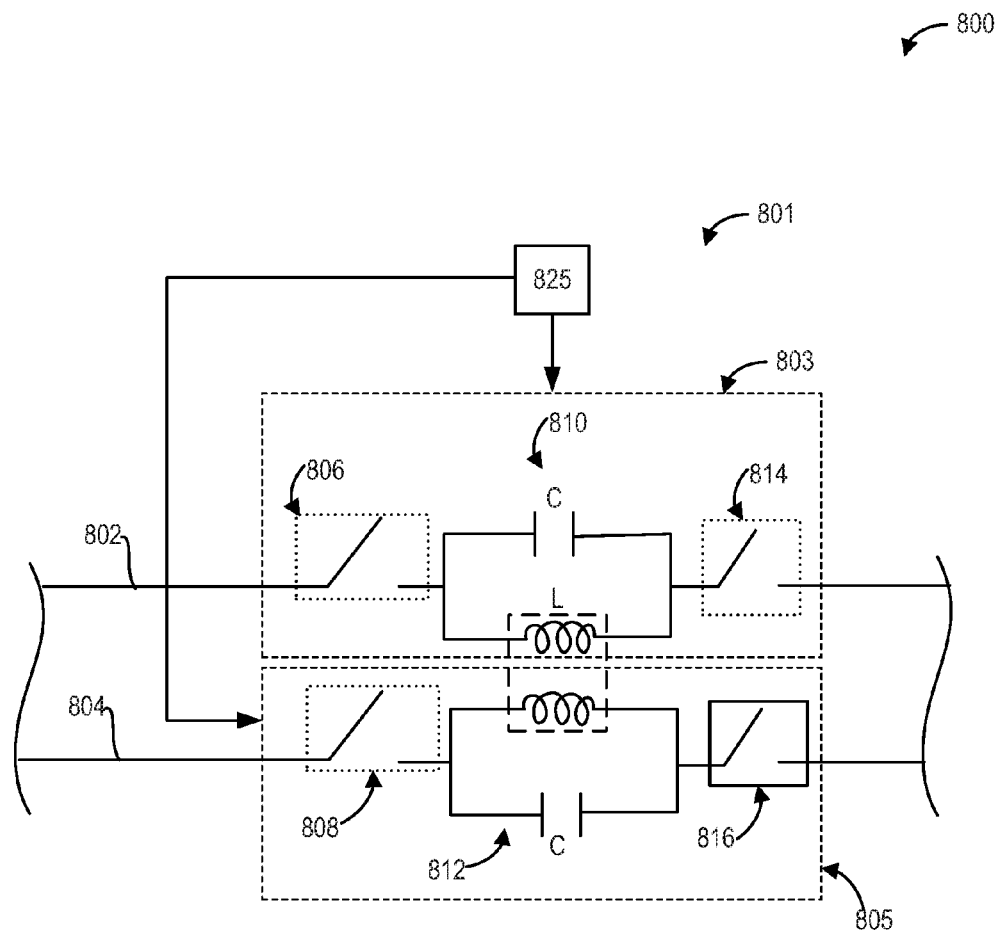
FIG. 8A is a partial cross-sectional view of the coil-interfacing cable including a plurality of hybrid switches, each having a pair of switches in series with a balun coupled to each of the signal line and ground line of the coil-interfacing cables.
Figure 8B:
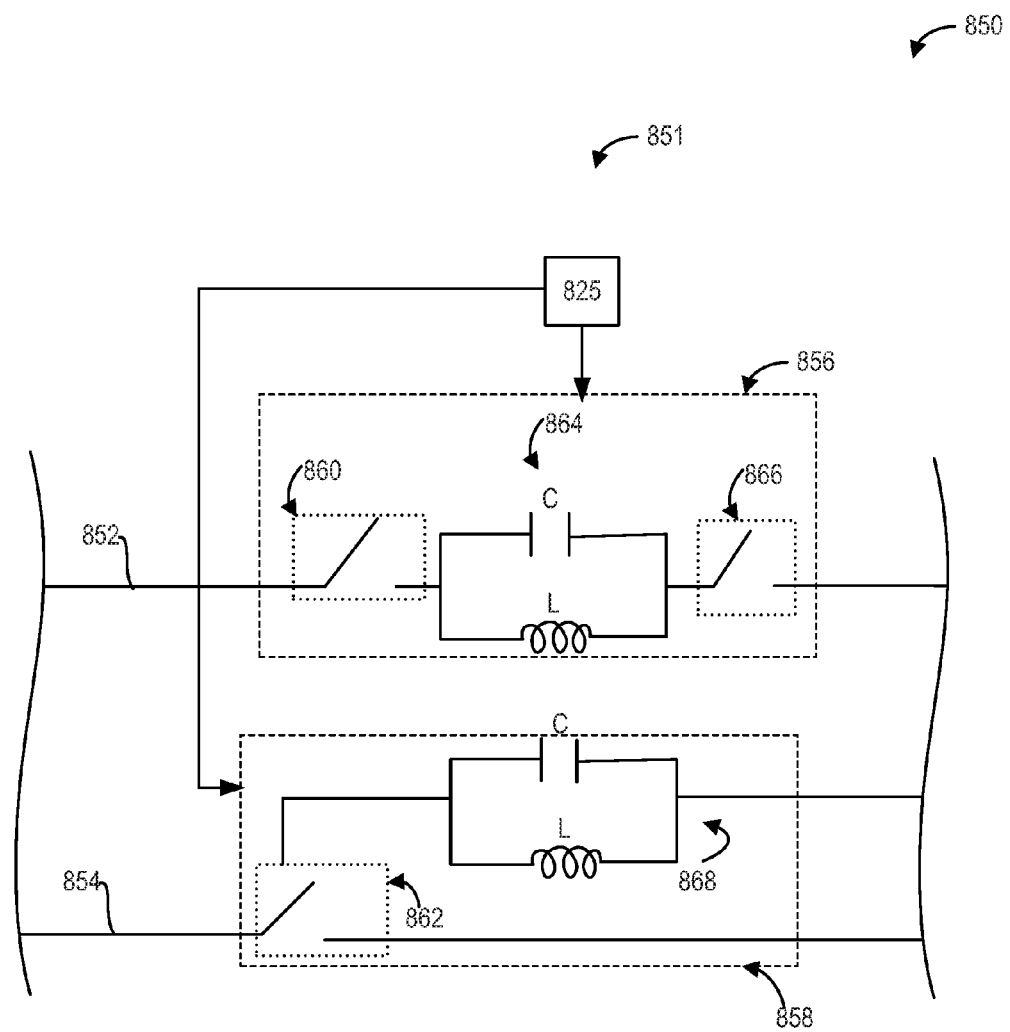
FIG. 8B is a partial cross-sectional view of the coil-interfacing cable including a plurality of hybrid switches, each having a switch in parallel to the balun coupled to DC line of the coil-interfacing cables.
Figure 9B:
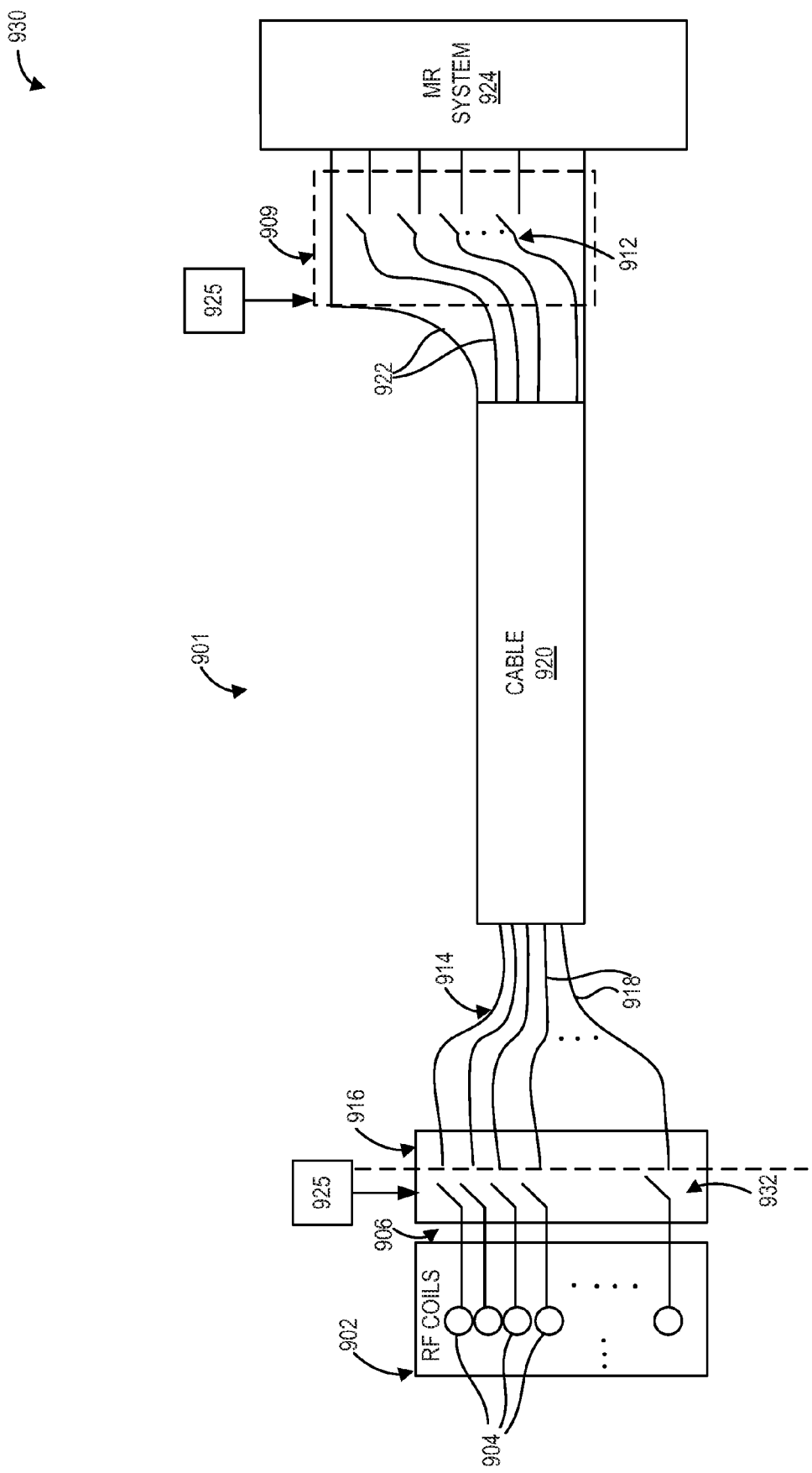
FIG. 9B is schematic view of the cabling system including the plurality of hybrid switches coupled to a coupling circuit of the coil-interfacing cable that is located near the RF coil elements.

FIG. 8A illustrates a partial cross-sectional view 800 of a coil-interfacing cable 801. The coil-interfacing cable 801 may be used in the MR imaging system to couple one or more RF coils (transmit/receive/gradient coils) to an MR system 824 having data acquisition systems, feedboards, coupling circuitry, preamplifiers, and the like. In one example, the coil-interfacing cable 801 may be carrying RF signals. However, in another example, the coil-interfacing cable 801 may be a DC cable supplying DC voltage to the components in the MR imaging system as shown in FIG. 8B.

Turning now to FIG. 8A, RF signals generated in the RF coils may propagate along a differential path created between a first line 802 (e.g., a ground line) and a second line 804 (e.g., an RF signal line). Herein, the first line 802 and the second line 804 may be resonated together. A first hybrid switch 803 may be coupled across the first line 802, and a second hybrid switch 805 may be coupled across the second line 804. The first hybrid switch 803 and the second hybrid switch 805 are electrically isolated from each other; however, they may be packaged together.

The hybrid switches may include one or more Gallium Nitride Field Effect Transistors (GaNFET), PIN diodes, relays, MEMS switches, and any combinations thereof.

The first hybrid switch 803 includes a first switch 806, a first resonance circuit or balun 810, and a second switch 814 coupled in series along the first line 802. Likewise, the second hybrid switch 805 includes a third switch 808, a second resonance circuit or balun 812, and a fourth switch 816 all coupled in series along the second line 804. The first, second, third, and the fourth switches of the first and the second hybrid switches may be one or more of MEMS switches and relays. In one example, the first, second, third, and the fourth switches may be mechanical switches such as MEMS switches (as described with reference to FIG. 5). For example, the first switch 806 and the second switch 814 may be MEMS switches in a back-to-back configuration, and similarly, the third switch 808 and the fourth switch 816 may be MEMS switches in a back-to-back configuration, as explained with reference to FIG. 5.

In another example, the hybrid switches may include relays. Relays are electrically operated switches. Similar to the MEMS switches described thus far, a control signal given to the relay may be able to open/close the switch.

The first switch 806 is coupled to the second switch 814 through the first balun 810. Likewise, the third switch 808 is coupled to the fourth switch 816 via the second balun 812. The first and the second balun may each include an inductor L parallel to a capacitor C. In one example, the first and the second balun may include different discrete capacitors and inductors, meaning that the first balun and second baluns may be separate circuit each having separate capacitors and inductors. In some examples, the capacitance and inductance values of the capacitors and the inductors may be the same for the first balun and the second balun. In another example, the first balun 810 may include a first capacitor C1 and the second balun 812 may include a second capacitor C2, wherein C1≠C2. In one example, the inductor L may include a wire wound around a conductor, wherein an inductance of the inductor L may depend on a number of wire wrappings around the conductor. As described previously, baluns (balanced to unbalanced) networks or common-mode traps are resonance circuits (e.g. LC circuits) that are included in RF circuits to block transmitter-driven common mode currents. Sometimes, when baluns are positioned too close to one another, they may become coupled due to fringe magnetic fields, thereby resulting in a detuning of the baluns, which may adversely affect the functioning of the baluns. By adapting conventional baluns with MEMS switches/relays, it is possible to reduce coupling between neighboring baluns, particularly during the transmit mode. In this way, detuning of baluns in MR systems may be reduced. Additionally, the common mode currents may be blocked by both the baluns and the MEMS switches, thereby reducing transmission of common mode currents through the coil-interfacing cables. As such, the hybrid traps or switches may reduce cable bulk, thus reducing manufacturing cost.

As shown in FIG. 8A, each hybrid switch may include the balun and MEMS switches/relays in series. Having the MEMS switches/relays and baluns in series ensures that the voltage survivability requirement (as explained with reference to FIG. 6A) is satisfied. In addition, including the resonant baluns with relay/MEMS switches in hybrid switches would solve both the heating and B1+ distortion (in transmit mode) and the B1− distortion (in receive mode) as explained below.

A hybrid switch controller 825 may control the operation of each of the first hybrid switch 803 and the second hybrid 805. The hybrid switch controller 825 is one non-limiting example of the switch controller 625 of FIG. 6B. The hybrid switch controller 825 may apply an actuation voltage to the first hybrid switch 803 to close each of the first switch 806 and the second switch 814, and additionally apply the same actuation voltage to the second hybrid switch 805 to close both the third switch 808 and the fourth switch 816 of the second hybrid switch 805. In case of MEMS switches, the actuation voltage may be applied across the gate of the MEMS switches to bring the beam element of each MEMS switch in electrical contact with the respective contact element (as described with reference to FIGS. 3 and 5). In a similar way, when the hybrid switch controller 825 stops applying the actuation voltage to the first hybrid switch, the first and the second switch of the first hybrid switch 803 may be opened, and in addition, when the controller stops applying the actuation voltage to the second hybrid switch, the third and the fourth switch of the second hybrid switch may be opened. For MEMS switches, stopping the application of the actuation voltage may result in the beam element of each of the MEMS switch being disconnected from the respective contact element (as described with reference to FIGS. 3 and 5).

During a receive operation, the hybrid switch controller 825 may apply the common actuation voltage to simultaneously close all the switches of the first and the second hybrid switches, thus providing a solid ground during the receive operation. In addition, during receive, the first balun 810 and the second balun 812 may be included in the first line 802 and the second line 804 respectively. Thus, during receive, a differential signal between the first line 802 and the second line 804 may be transmitted but a common mode signal between the first line 802 and the second line 804 may be blocked by the baluns, thus reducing any B1− distortion of the MR signals produced by the currents. During a transmit operation, the switch controller may cease or stop the application of the actuation voltage to simultaneously open all the switches, thus removing the baluns from the first and the second lines, and forming an open circuit during the transmit operation. As such, any heat that is generated in the balun is not dissipated through the cable, thus reduce heating in the cables, and thereby making the cables cooler, thus more patient friendly.

In some example embodiments, the relays/MEMS switches of the hybrid switches may be in parallel to ensure that a relay/MEMS trap can meet high RF current requirements as shown in FIG. 8B. The receive RF coils are typically supplied power through a series of DC cables. During the transmit pulse with the transmit coil, large voltages and currents can be induced in the DC cables and the shields of the coaxial cables. A pair of hybrid switches may be used to protect the sensitive baluns and RF coil elements such large voltages and currents. Turning now to FIG. 8B, it illustrates a partial cross-sectional view 850 of a coil-interfacing cable 851. The coil-interfacing cable 851 may include a first line 852 (e.g., ground line) and a second line 854 (e.g., signal line). Herein, the signal line 854 may be a DC power supply line. In one example, the coil-interfacing cable 851 may supply a 10V DC voltage to a preamplifier coupled to a RF coil.

The first line 852 includes a first hybrid switch 856 having a first switch 860, a first balun 864, and a second switch 866 in series. The first switch 860, the first balun 864, and the second switch 866 are similar to the first switch 806, the first balun 810, and the second switch 814 of the first hybrid switch 803 described with reference to FIG. 8A. As described with reference to FIG. 8A, the switch controller 825 may apply an actuation voltage to both the first and the second switch of the first hybrid switch 856 to close both the first and the second switches of the first hybrid switch. As before, the switch controller 825 may stop applying the actuation voltage to open both the switches of the first hybrid switch 856.

The second line 854 includes a second hybrid switch 858 including a switch 862 and a balun 868. Unlike the second hybrid switch 805 of FIG. 8A, the balun 868 of the second hybrid switch 858 is parallel to the second line 854, and not in series.

The hybrid switches may be used with both conventional and coaxial structures of ribbon cabling as shown in FIGS. 9A-C. Turning now to FIG. 9A, schematic view 900 shows an RF coil assembly 902 connected to an MR system 924 through a cabling system 901. Herein, the RF coil assembly 902 includes an array of receive RF coil elements 904. Each RF coil element 904 of the RF coil assembly 902 may be a non-limiting example of RF coil 14 of FIG. 1 (and/or RF coil 202 of FIG. 2, RF coils 402 of FIG. 4, RF coil 604 of FIGS. 6A-B). In one example, each receive RF coil element 904 may be a single loop oriented orthogonally to a body coil (such as body coil 15 of FIG. 1). In another example, the RF coil element 904 may be two-loop Helmholtz or multi-loop (solenoid) configuration. In yet another example, one or more of the RF coil elements may be coupled together to form a quadrature or circularly polarized configuration. As an example, one or more of the receive RF coil elements 904 may be coupled together to form a coil segment 906. An example configuration in which two pairs of RF coil elements are arranged about the signal source results in a coil segment that includes a quadrature or circularly polarized configuration.

One way to isolate the RF coil assembly during transmit operation is to disconnect and float the RF coil assembly by using a plurality of switches 910 coupled across the terminals of the RF coil elements 904 (as described with reference to FIG. 4). In one example, the plurality of switches may be examples of MEMS switches of the MEMS devices 406 and 408 as described with reference to FIGS. 4 and 5. In another example, the plurality of switches 910 may be examples of hybrid switches (such as hybrid switches 803, 805, 856, and 858 described with reference to FIGS. 8A and 8B). As described previously, during the transmit operation, the plurality of switches 910 may be operated such that all the switches are open, thus altering the impedance to provide isolation to the receive RF coil. In this way, the device may function as common-mode choke thereby reducing propagation of common mode currents in MRI systems.

Another way to reduce common mode current propagation is by using a plurality of switches along signal and ground lines of coil-interfacing cables as explained with reference to FIGS. 8A-B. In one example, a plurality of switches 912 may be coupled to an end of a coil-interfacing cable 920 of the cabling system 901 that is closest to a MR system 924. As used herein, the end of the coil-interfacing cable that is closest to the MR system may include the end that is couplable to the MR system, and that is opposite the end that is couplable to the plurality of RF coils. A driver or switch controller 925 may drive the matrix or plurality of switches 912 to open and close the switches 912 during transmission and receiving cycles respectively.

In an example embodiment, the driver 925 may be mounted onto a p-connector side of the coil-interfacing cable 920 or in the p-connector 909 itself, with DC cables connecting the driver 925 to the switches 912. The plurality of switches 912 may include only MEMS switches (as described with reference to FIG. 6B), or only relays, or may include hybrid switches using a combination of relays/ MEMS devices and baluns (as described with reference to FIGS. 8A-B).

When the connector 909 is plugged into a corresponding outlet of the MR system 924, each RF coil segment 906 may be mechanically coupled to a corresponding receiver channel in the MR system 924. Generally, an output of each receiver channel generates a partial view of the entire anatomy being imaged, and is subsequently combined with output from the other channels to produce the final MR image. During a receive operation, the driver 925 may apply an actuation voltage to all of the switches of the plurality of switches 912 to close all the switches, thereby electrically coupling the MR system 924 to each coil segment 906. In the example configuration where the RF coil assembly 902 also includes a plurality of switches 910, the driver 925 (or a different switch controller) may additionally apply the actuation voltage to close all the switches 910 to electrically connect each RF coil element 904 with the corresponding channel of the MR system 924. In this way, the RF coil elements 904 may be electrically coupled to the MR system during receive operation.

However, during the transmit operation, the driver may stop applying voltage to the plurality of switches 912 and the plurality of switches 910 (if included). As a result, the RF coil elements may be disconnected and electromagnetically isolated from the MR system during the transmit operation.

Turning now to FIG. 9B, schematic view 930 shows the RF coil assembly 902 coupled to the MR system 924 through the cabling system 901 with a plurality of switches 932 included in a module or coupling circuit 916. Herein, the plurality of switches 932 may be similar to the plurality of switches 910 in structure. The plurality of switches 932 may include one or more MEMS switches in a back-to-back configuration and hybrid switches or traps including MEMS switches/relays in conjunction with resonance circuits. In some embodiments, the plurality of switches 932 may be included along the coil-interfacing cable 920 in addition to the plurality of switches 910 (FIG. 9A) coupled to terminal of the RF coil elements. In other embodiments, the plurality of switches 932 may be included as a replacement of the plurality of switches 910 (FIG. 9A). Additionally or optionally, the cabling system may include a plurality of switches 912 coupled to the connector 909 coupling the coil-interfacing cable 920 to the MR system 924. Herein, the coupling circuit 916 may include pre-amplifiers, filters, analog-to-digital conversion circuitry, demodulation/mixer devices, and the like. The plurality of switches 932 may be coupled to an end of the coil-interfacing cable 920 at a location that is proximate or near the terminals if the RF coil elements. As used herein, the end of the coil-interfacing cable that is near the terminals of the RF coil elements may include the end that is couplable to the RF coil elements, and that is opposite to the end that is couplable to the MR system, and "near" and/or "closer" to a connector of the coil-interfacing cable may include within a threshold distance of the connector, such as within 10 cm or within 10% of the length of the coil-interfacing cable.

In one example, each coil segment 906 may be coupled to a pre-amplifier in the coupling circuit 916 through a hybrid switch 932. In such an example, the hybrid switch may be included at an input of the pre-amplifier. During receive operation, the switch controller 925 may apply the actuation voltage to the plurality of switches 932 to close all the switches 932. As a result, a balun may be coupled to the input of each of the pre-amplifier in the coupling circuit 916. The balun may additionally serve as an input balun to block common-mode currents (as explained in FIGS. 2 and 4), and thereby reducing pre-amplifier saturation. However, during transmit operation, the switch controller 925 may stop the actuation voltage to the plurality of switches 932 to open all the switches 932. As a result, the input terminals of the pre-amplifier may be open, thus providing high isolation between the terminals of the pre-amplifier and thus blocking common-mode current from flowing into the pre-amplifier. In this way, the hybrid switches or traps may be used to selectively couple and decouple resonance circuits to the pre-amplifier, and thereby reduce saturation in pre-amplifiers.

Turning now to FIG. 9C, schematic view 930 shows a modified cable trap 952 coupled to the coil-interfacing cable 920. As explained earlier, conventional cable traps are bulky and detrimental to work flow in a clinical setting. As such, careful positioning of MR coil cabling is required so that patient contact with the cable does not occur and create safety concerns. Generally, cable traps are expensive and require skilled human labor to manufacture, taking typically two to three hours of assembly and labor to manufacture. In addition, cable traps generate a lot of heat, often watts of power. RF energy is converted to heat leading to the necessity of bulky, thick mechanical insulators in cable traps.

In one example, the cable trap 952 may include a plurality of MEMS switches 954 (954-1 through 954-$n$) coupled to a plurality of capacitors $C_1$ through $C_n$. Herein, each MEMS switch (954-1, 954-2, and so on) of the plurality of MEMS switches 954 may be one or more of a MEMS device (such as a MEMS device described with reference to FIGS. 3-5) and a hybrid MEMS switch (such as a hybrid switch described with reference to FIGS.8A-B). Each switch may include one or more of MEMS switches in back-to-back configuration (as explained with reference to FIGS. 3 and 5). The switch controller 925 may be able to selectively apply the actuation voltage to one of the plurality of switches 954 to close that switch. For example, the switch controller 925 may select the switch 954-1 and apply the actuation voltage to only switch 954-1 of the plurality of switches 954. Applying the actuation voltage to switch 954-1 may close only that switch and leave the rest of the switches (e.g., 954-2, 954-3, and on up to 950-$n$) open. When switch 954-1 is closed, a frequency of the cable trap 952 may be based on the capacitance of the capacitor $C_1$. In a similar way, if switch 954-2 is closed, then the frequency of the cable trap 952 may be based on the capacitance of the capacitor C2. In this way, the cable trap may be a multi-frequency trap with the frequency programmable based on the selection and actuation of one or more switches in the cable trap 952.

Turning now to FIG. 7, an example method 700 for opening and closing a conductor path of a coil-interfacing cable is shown. Specifically, the opening and closing of the conductor path is achieved by opening and closing a plurality of switches integrated into the signal and ground line of the coil-interfacing cable. Method 700 may be carried out by the components and systems depicted in FIGS. 1 through 6, and FIGS. 8A through 9C; however, it should be understood that the method may be implemented on other components and systems not depicted without departing from the scope of the present disclosure. Instructions for carrying out method 700 herein may be executed by a controller (e.g., controller 25 of FIG. 1, switch controllers 302, 418 and 625 of FIGS. 3, 4, 5, and 6A-B, and/or switch controller 825 and 925 of FIGS. 8A-B and 9)A-C based on instructions stored on a memory of the controller and in conjunction with signals received from sensors of the imaging system, such as the sensors described above with reference to FIGS. 1-5, 6A-B and 8A-Band 9A-C.

The controller may employ actuators of the MRI imaging system to adjust the operation of the imaging system and the RF coils according to the methods described below. As an example, during a receive operation, the controller may apply an actuation voltage to the plurality of switches coupled to signal and ground lines of the coil-interfacing cable close the plurality of switches. As a result, the conductor path of the coil-interfacing cable may be closed. As another example, during a transmit operation, the controller may stop applying the actuation voltage to the plurality of switches, thereby opening all the switches and disconnecting the conductor path of the coil-interfacing cable.

Method 700 begins at 702, where the method includes during transmit operation of a plurality of receive RF coil elements operating a first hybrid switch assembly and a second hybrid switch assembly in a first mode to open a conductor path of a coil-interfacing cable. The first hybrid switch assembly may be coupled to a first line of the cable, and the second hybrid switch assembly coupled to a second, different line of the cable.

The coil interfacing cable may include a plurality of lines. In one example, the plurality of lines may include RF signal lines, RF ground lines, and DC lines. Herein, the plurality of switches may be coupled to each RF signal line, RF ground line, and DC line of the coil-interfacing cable. The RF signal and RF ground lines of the coil-interfacing cable may couple RF coil elements to an MR imaging system. The DC line of the coil-interfacing cable may supply DC voltage to the components of the MR imaging system. The conductor path may include an electrical path along which signals (e.g., RF signals, DC voltages, and the like) may be propagate. Herein, the conductor path refers to the electrical path of the coil-interfacing cable coupling the RF coil elements to different components of the MR system. When the conductor path is disconnected, there is an interruption in the flow of the signals along the coil-interfacing cable. An interruption in the electrical connection may be needed during transmit operation of the RF coil elements to reduce electromagnetic coupling of receive RF coil elements and transmit RF coil elements, for example.

Herein, the first and the second hybrid switch assemblies may each be a hybrid cable trap assembly or hybrid switches similar to hybrid switches 803, 805, 856, and 858, having a pair of switches coupled to a resonance circuit or balun. In the case of RF signal and ground lines, the plurality of switches may include a first switch coupled in series to a balun, which in turn is coupled in series to a second switch. In one example, each of the first switch and the second hybrid switch assemblies may include a pair of MEMS switches (e.g., MEMS devices 300 of FIG.3 and/or MEMS devices 406 and 408 of FIGS. 4 and 5) in series with a resonance circuit or balun. In the case of DC lines, the second hybrid switch assembly may include a MEMS switch and a resonance circuit parallel to the second line 854. As such, DC control signal from the MRI system may be used for control of MEMS switches and multiple MEMS switches may be controlled using one control signal since the MEMS switches are voltage controlled.

The first and the second set of hybrid switch assemblies may be coupled to different lines of the coil-interfacing cables. These assemblies may be coupled along different locations of the coil-interfacing cable. Irrespective of where these assemblies are located along the coil-interfacing cable, their operation may be the same. For example, during transmit operation, the goal is to isolate the receive RF coil elements from the MR system and the transmit coil. One way to achieve the electromagnetic isolation of the receive RF coil elements from the MR system and the transmit coil is to entirely disconnect the lines of the coil-interfacing cables that couple the receive RF coil elements to the MR system, for example. By including switches along the lines of the coil-interfacing cables, it is possible to open the switches during transmit operation, and disrupt the propagation of the signals along the coil-interfacing cable. In this way, the signals picked up by the receive coils may not be able to flow to the MR system or couple with the transmit coil signals and distort the MR signals of the imaging system.

In one example, the first and the second hybrid switch assemblies may be located at an end of the cable that couples to the MR system (hence father from the RF coil terminals).

In another example, the assemblies may be included at an end that is closer to the receive RF coil terminals (hence father from the MR system).

At 704, method 700 includes operating in the first mode by ceasing application of an actuation voltage to open the pair of switches of the first hybrid switch assembly coupled to the RF signal line to disconnect the conductor path of the signal line. Additionally, the method includes opening the pair of switches of second hybrid switch assembly coupled to RF ground line of the coil-interfacing cable to disconnect the conductor path of the ground line. By disconnecting the conductor path of both the signal and the ground lines, the conductor path of the cable may be disconnected, thus disrupting the propagation of signal in the lines of the cable.

In one example, the pairs of switches may include MEMS switches. Herein, a controller (such as a switch controller 925 of FIG. 9A-C) may stop applying the actuation voltage between the gate and beam electrode of the MEMS switches. As a result, the beam element of each of the MEMS switch is separated from the corresponding contact element, thus opening all the MEMS switches.

The first and the second hybrid switch assemblies may be coupled to an end of the coil-interfacing cable that is closest to an MR system. Herein, the plurality of switches may be coupled at or near (e.g., within 10 cm or within 10% of length of the cable) a connector, which couples the end of the coil-interfacing cable to the MR system. Ceasing application of actuation voltage and opening the pairs of switches of both the assemblies may include opening the switches of the connector at 706, to disconnect the connector from the MR system, and thus disconnecting the coil-interfacing cable from the MR system during the transmit operation. In this way, the common mode currents flowing from the RF coil elements through the coil-interfacing cables may be interrupted at the connector. Additionally, the RF coil element may be isolated from the MR system.

In some embodiments, the common mode currents may be interrupted at the terminal of the receive RF coil and/or at the input of a coupling circuit or module that is coupled to the terminal of the RF coil. In one example, the first and the second hybrid switch assemblies may be coupled to each terminal of the RF coil, and by opening all the pairs of switches, the RF coil terminals may be floated, thus isolating the RF coil from the transmit coil and the MR system. Additionally or optionally, the first and the second hybrid switch assemblies may be integrated to the coupling circuit that couples the RF coil terminal to pre-amplifiers of the coupling circuit, for example. In such an example, when all the switches in both the assemblies are opened, the RF coil terminals may be disconnected from the pre-amplifiers at 708, and thus common mode currents may be interrupted.

In some example embodiments, the hybrid switch assemblies may be integrated with the cable traps of the coil-interfacing cables. In such embodiments, when the switches are opened during transmit operation, the cable traps positioned along the coil-interfacing cables may be disconnected at 710.

In this way, the first and the second hybrid switch assemblies may be placed along multiple locations in the cabling system of the MR imaging system, and may be advantageously opened during transmit operation, to interrupt common mode currents, and additionally isolate the RF coil from the MR imaging system, and transmit coil, thereby reducing unwanted coupling between the coils.

At 712, method 700 includes during a receive operation, operating the first and the second hybrid switch assemblies in a second mode to close the conductor path of the coil-interfacing cable. Herein, the pair of switches of each of the first and the second hybrid switch assemblies coupled to respective baluns is operated in the second mode.

At 714, method 700 includes applying the actuation voltage to close the pair of switches of the first and the second hybrid switch assemblies coupled to the RF signal line and the RF ground line of the coil-interfacing cable to connect both the signal and the ground lines, and thereby connect the conductor path of the coil-interfacing cable.

As such, the controller may apply the actuation voltage between the gate and beam electrode of the MEMS switches. As a result, the beam element of each of the MEMS switch is brought in contact with the corresponding contact element, thus closing all the MEMS switches.

In the example configuration where the first and the second hybrid switch assemblies are coupled to the end of the coil-interfacing cable that is closest to an MR system via a connector, applying the actuation voltage and closing the all the switches of the first and the second hybrid switch assemblies may include closing all the switches of the connector at 716, to reconnect the connector to the MR system, and thus reconnecting the coil-interfacing cable to the MR system during the receive operation. In this way, the baluns may be included in the coil-interfacing cable, and common mode currents flowing from the RF coil elements through the coil-interfacing cables may be blocked by the baluns.

In the example configuration wherein the first and the second hybrid switch assemblies are coupled to each terminal of the RF coil, closing the switches may reconnect the RF coil terminals to the pre-amplifiers at 718. Specifically, closing the switches may result in the baluns being included between the RF coil terminal and the pre-amplifier. In this case, the balun may serve as an input balun and common-mode currents may be blocked.

In the embodiment wherein the first and the second hybrid switch assemblies are integrated with the cable traps of the coil-interfacing cables, when the plurality of switches are closed during transmit operation at 720, the cable traps positioned along the coil-interfacing cables may be reconnected, thus filtering common-mode currents flowing along the coil-interfacing cable.

In this way, the first and the second hybrid switch assemblies may be placed along multiple locations in the cabling system of the MR imaging system, and may be advantageously closed during transmit operation, to block common mode currents, and additionally couple the RF coil from the MR imaging system, and transmit coil, thereby transmitting RF signals from the receive coils to the MR imaging system.

The technical effect of using hybrid switch assemblies in different locations along the coil-interfacing cable, is that the switches can be opened to isolate the coils during transmit, and further function as a common-mode choke, thus reducing the propagation of common-mode current to the feed-boards and cables. In addition, during receive, the solid ground connection may be restored, and the conventional baluns may be included in the circuitry to reduce common-mode current propagation. Common-mode currents flowing along the cables may excite anatomy, and may generate unwarranted MR signals. In some examples, the common-mode current may suppress MR signals from an area that is being imaged. The local fields created by the currents may lead to local B1 field distortions. Thus, by reducing the common-mode current by opening the switches coupled to the coil-interfacing cables, distortions in MR signals may be reduced. In addition, by using such hybrid switches, resonance circuits may be integrated with the coil-interfacing cables, to be built into the MR apparatus, thus reducing cable bulk. Furthermore, the MEMS devices are electrostatically driven, thus can quickly transition from an open to a closed state. Thus, the MR apparatus may be switched from transmit to receive operation at higher speed, thereby allowing the imaging to be performed at a faster rate. This in turn may reduce the exposure of the patient to radiation.

The systems and methods described above provide for a a cabling system, comprising a first line of a coil-interfacing cable having a first set of hybrid switches, the first set of hybrid switches including a first switch, a first resonance circuit, and a second switch connected in series, and a second line of the coil-interfacing cable having a second set of hybrid switches, the first line and the second line of the coil-interfacing cable operably coupling one or more radio frequency (RF) coil elements to respective channels of a magnetic resonance (MR) system. In a first example of the system, the system may additionally or alternatively include wherein the second set of hybrid switches includes a third switch, a second resonance circuit, and a fourth switch coupled in series with the second line of the coil-interfacing cable, and wherein each of the first resonance circuit and the second resonance circuit includes discrete capacitors and inductors. A second example of the system optionally includes the first example and further includes wherein each of the first switch, second switch, third switch, and fourth switch includes one or more of a microelectromechanical system (MEMS) switch, a gallium nitride field effect transistor (GaNFET), a diode, and a relay. A third example of the system optionally includes one or more of the first and the second examples, and further includes a controller operably coupled to each of the first set of hybrid switches and the second set of hybrid switches, and configured with instructions in non-transitory memory that when executed cause the controller to: during a receive operation, apply a signal to each of the first switch and the second switch to close both the first switch and the second switch of the first set of hybrid switches to electrically couple each of the first switch and the second switch with the first resonance circuit to block common mode current flowing through the first line of the coil-interfacing cable. A fourth example of the system optionally includes one or more of the first through the third examples, and further includes wherein the controller is further configured with instructions in non-transitory memory that when executed cause the controller to: during the receive operation, apply the signal to each of the third switch and the fourth switch to close both the third switch and the fourth switch of the second set of hybrid switches to electrically couple each of the third switch and the fourth switch with the second resonance circuit to block common mode currents flowing through the second line of the coil-interfacing cable. A fifth example of the system optionally includes one or more of the first through the fourth examples, and further wherein the controller is further configured with instructions in non-transitory memory that when executed cause the controller to: during a transmit operation, stop applying the signal to each of the first switch and the second switch to open both the first switch and the second switch of the first set of hybrid switches to electrically disconnect the first line of the coil-interfacing cable, and stop applying the signal to each of the third switch and the fourth switch to close both the third switch and the fourth switch of the second set of hybrid switches to electrically disconnect the second line of the coil-interfacing cable. A sixth example of the system optionally includes one or more of the first through the fifth examples, and further includes wherein each of the first set of hybrid switches and the second set of hybrid switches is coupled to a first end of the coil-interfacing cable at or near terminals of the RF coil elements. A seventh example of the system optionally includes one or more of the first through the sixth examples, and further wherein each of the first set of hybrid switches and the second set of hybrid switches is coupled to a second end of the coil-interfacing cable proximate to the MR system.

The systems and methods described above also provide for a method, the method, comprising during a transmit operation of a plurality of receive radio frequency (RF) coil elements, operating a first hybrid switch assembly and a second hybrid switch assembly in a first mode to open a conductor path of a coil-interfacing cable, the coil-interfacing cable including a signal line and a ground line, the first hybrid switch assembly coupled to the signal line and the second hybrid switch assembly coupled to the ground line, each hybrid switch assembly having a pair of switches coupled to a balun, and during a receive operation of the plurality of receive RF coil elements, operating each of the first hybrid switch assembly and the second hybrid switch assembly in a second mode to close the conductor path of the coil-interfacing cable. In a first example of the method, the method may additionally or alternatively include wherein operating in the first mode includes ceasing application of an actuation voltage to open the pair of switches of the first hybrid switch assembly coupled to the signal line to disconnect the conductor path of the signal line, and ceasing application of the actuation voltage to open the pair of switches of the second hybrid switch assembly coupled to the ground line to disconnect the conductor path of the ground line. A second example of the method optionally includes the first example, and further includes wherein operating in the second mode includes applying the actuation voltage to close the pair of switches of the first hybrid switch assembly coupled to the signal line to reconnect the conductor path of the signal line to block common mode currents in the signal line, and applying the actuation voltage to close the pair of switches of the second hybrid switch assembly coupled to the ground line to reconnect the conductor path of the ground line to block common mode currents in the ground line. A third example of the method optionally includes one or more of the first and the second examples, and further includes wherein the first hybrid switch assembly and the first hybrid switch assembly are located at or near a connector that couples the coil-interfacing cable to a magnetic resonance (MR) system. A fourth example of the method optionally includes one or more of the first through the third examples, and further includes wherein the opening of the pair of switches of each of the first hybrid switch assembly and the second hybrid switch assembly during transmit operation includes electrically decoupling the connector from the MR system to isolate the plurality of RF coil elements from the MR system, the plurality of RF coil elements coupled to the MR system via the coil-interfacing cable, and wherein the closing of the pair of switches of each of the first hybrid switch assembly and the second hybrid switch assembly during receive operation includes electrically coupling the connector to the MR system to couple the plurality of RF coil elements to the MR system. A fifth example of the method optionally includes one or more of the first through the fourth examples, and further includes wherein the first hybrid switch assembly and the second hybrid switch assembly are located in a module having a plurality of preamplifiers, and wherein the operating the pair of switches of each of the first hybrid switch assembly and the second hybrid switch assembly in the first mode includes opening the pair of switches of both the first hybrid switch assembly and the second hybrid switch assembly to disconnect the plurality of preamplifiers from the conductor path, and wherein operating the switches in the second mode includes closing the pair of switches of both the first hybrid switch assembly and the second hybrid switch assembly to connect the plurality of preamplifiers to the conductor path. A sixth example of the method optionally includes one or more of the first through the fifth examples, and further includes wherein the plurality of switches are located in a cable trap of the coil-interfacing cable. A seventh example of the method optionally includes one or more of the first through the third examples, and further includes wherein the plurality of switches include one or more of MEMS switches and relays.

The systems and methods described above also provide for a system, the system, comprising a plurality of receive radio frequency (RF) coils configured to receive RF signals and send the RF signals along a receive path, a magnetic resonance (MR) system configured to process the RF signals to generate an MR image, a cable placed along the receive path operably coupling the plurality of receive RF coils to the MR system, the cable having a plurality of hybrid switches each including a first switch, a balun, and a second switch in series coupled to each line of the cable, and a controller operably coupled to the plurality of hybrid switches and configured with instructions in non-transitory memory that when executed cause the controller to: in response to a receive to transmit transition, adjust the plurality of hybrid switches from an open position to a closed position to electrically disconnect the plurality of receive RF coils from the receive path, and in response to a transmit to receive transition, adjust the plurality of hybrid switches from the closed positon to the open position to electrically connect the plurality of receive RF coil to the receive path. In a first example of the system, the system may additionally or alternatively include wherein the plurality of hybrid switches is located at or near terminals of the plurality of RF coils. A second example of the system optionally includes one or more of the first and the second example, and further includes wherein the plurality of hybrid switches is located inside a cable trap of the cable. A third example of the system optionally includes one or more of the first and the second examples, and further includes wherein the plurality of hybrid switches is located at or near a connector of the cable, the connector coupling the cable to the MR system. As used herein, an element or step recited in the singular and proceeded with the word "a" or "an" should be understood as not excluding plural of said elements or steps, unless such exclusion is explicitly stated. Furthermore, references to "one embodiment" of the present invention are not intended to be interpreted as excluding the existence of additional embodiments that also incorporate the recited features. Moreover, unless explicitly stated to the contrary, embodiments "comprising," "including," or "having" an element or a plurality of elements having a particular property may include additional such elements not having that property. The terms "including" and "in which" are used as the plain-language equivalents of the respective terms "comprising" and "wherein." Moreover, the terms "first," "second," and "third," etc. are used merely as labels, and are not intended to impose numerical requirements or a particular positional order on their objects.

This written description uses examples to disclose the invention, including the best mode, and also to enable a person of ordinary skill in the relevant art to practice the invention, including making and using any devices or systems and performing any incorporated methods. The patentable scope of the invention is defined by the claims, and may include other examples that occur to those of ordinary skill in the art. Such other examples are intended to be within the scope of the claims if they have structural elements that do not differ from the literal language of the claims, or if they include equivalent structural elements with insubstantial differences from the literal languages of the claims.

The invention claimed is:

1. A method, comprising:
    during a transmit operation of a plurality of receive radio frequency (RF) coil elements, operating a first hybrid switch assembly and a second hybrid switch assembly in a first mode to open a conductor path of a coil-interfacing cable, the coil-interfacing cable including a signal line and a ground line, the first hybrid switch assembly coupled to the signal line and the second hybrid switch assembly coupled to the ground line, each hybrid switch assembly having a respective first switch, a respective balun, and a respective second switch in series coupled to a respective one of the signal line and the ground line of the coil-interfacing cable; and
    during a receive operation of the plurality of receive RF coil elements, operating each of the first hybrid switch assembly and the second hybrid switch assembly in a second mode to close the conductor path of the coil-interfacing cable.

2. The method of claim 1, wherein operating in the first mode includes:
    ceasing application of an actuation voltage to open the first and second switches of the first hybrid switch assembly coupled to the signal line to disconnect the conductor path of the signal line; and
    ceasing application of the actuation voltage to open the first and second switches of the second hybrid switch assembly coupled to the ground line to disconnect the conductor path of the ground line.

3. The method of claim 2, wherein operating in the second mode includes:
    applying the actuation voltage to close the first and second switches of the first hybrid switch assembly coupled to the signal line to reconnect the conductor path of the signal line to block common mode currents in the signal line; and
    applying the actuation voltage to close the first and second switches of the second hybrid switch assembly coupled to the ground line to reconnect the conductor path of the ground line to block common mode currents in the ground line.

4. The method of claim 2, wherein the first hybrid switch assembly and the second hybrid switch assembly are located at or near a connector that couples the coil-interfacing cable to a magnetic resonance (MR) system.

5. The method of claim 4, wherein the opening of the respective first and second switches of each of the first hybrid switch assembly and the second hybrid switch assembly during the transmit operation includes electrically decoupling the connector from the MR system to isolate the plurality of receive RF coil elements from the MR system, the plurality of receive RF coil elements coupled to the MR system via the coil-interfacing cable, and wherein the closing of the respective first and second switches of each of the first hybrid switch assembly and the second hybrid switch assembly during the receive operation includes electrically coupling the connector to the MR system to couple the plurality of receive RF coil elements to the MR system.

6. The method of claim 1, wherein the first hybrid switch assembly and the second hybrid switch assembly are located in a module having a plurality of preamplifiers, and wherein the operating the respective first and second switches of each of the first hybrid switch assembly and the second hybrid switch assembly in the first mode includes opening the respective first and second switches of both the first hybrid switch assembly and the second hybrid switch assembly to disconnect the plurality of preamplifiers from the conductor path, and wherein operating the respective first and second switches in the second mode includes closing the respective first and second switches of both the first hybrid switch assembly and the second hybrid switch assembly to connect the plurality of preamplifiers to the conductor path.

7. The method of claim 1, wherein the respective first and second switches are located in a cable trap of the coil-interfacing cable.

8. The method of claim 1, wherein the respective first and second switches include one or more of MEMS switches and relays.

9. A system, comprising:
- a plurality of receive radio frequency (RF) coils configured to receive RF signals and send the RF signals along a receive path;
- a magnetic resonance (MR) system configured to process the RF signals to generate an MR image;
- a cable placed along the receive path operably coupling the plurality of receive RF coils to the MR system, the cable having a plurality of hybrid switches each including a first switch, a balun, and a second switch in series coupled to each line of the cable; and
- a controller operably coupled to the plurality of hybrid switches and configured with instructions in non-transitory memory that, when executed, cause the controller to:
  - in response to a receive to transmit transition, adjust the plurality of hybrid switches from an open position to a closed position to electrically disconnect the plurality of receive RF coils from the receive path; and
  - in response to a transmit to receive transition, adjust the plurality of hybrid switches from the closed positon to the open position to electrically connect the plurality of receive RF coils to the receive path.

10. The system of claim 9, wherein the plurality of hybrid switches is located at or near terminals of the plurality of receive RF coils.

11. The system of claim 9, wherein the plurality of hybrid switches is located inside a cable trap of the cable.

12. The system of claim 9, wherein the plurality of hybrid switches is located at or near a connector of the cable, the connector coupling the cable to the MR system.

* * * * *